US012796194B2

(12) United States Patent
Hsieh et al.

(10) Patent No.: US 12,796,194 B2
(45) Date of Patent: Nov. 10, 2026

(54) SEMICONDUCTOR DEVICE AND MANUFACTURING METHOD THEREOF

(71) Applicant: EPISTAR CORPORATION, Hsinchu (TW)

(72) Inventors: Min-Hsun Hsieh, Hsinchu (TW); Shih-An Liao, Hsinchu (TW)

(73) Assignee: Ennostar Corporation, Hsinchu City (TW)

( * ) Notice: Subject to any disclaimer, the term of this patent is extended or adjusted under 35 U.S.C. 154(b) by 821 days.

(21) Appl. No.: 17/962,207

(22) Filed: Oct. 7, 2022

(65) Prior Publication Data

US 2023/0119631 A1 Apr. 20, 2023

Related U.S. Application Data

(60) Provisional application No. 63/262,524, filed on Oct. 14, 2021.

(30) Foreign Application Priority Data

Apr. 28, 2022 (TW) ................................. 111116290
Jun. 24, 2022 (TW) ................................. 111123680

(51) Int. Cl.

| | |
|---|---|
| ***H10H 20/857*** | (2025.01) |
| ***H10H 20/01*** | (2025.01) |
| ***H10H 20/831*** | (2025.01) |
| ***H10W 90/00*** | (2026.01) |

(52) U.S. Cl.

CPC .......... *H10H 20/857* (2025.01); *H10H 20/01* (2025.01); *H10H 20/8312* (2025.01); *H10W 90/00* (2026.01); *H10H 20/032* (2025.01); *H10H 20/0364* (2025.01)

(58) Field of Classification Search

CPC ............. H10H 20/857; H10H 20/8312; H10H 20/032; H10H 20/034; H10H 20/8314

See application file for complete search history.

(56) References Cited

U.S. PATENT DOCUMENTS

2005/0194676 A1* 9/2005 Fukuda ................ H10W 74/111 257/725
2006/0202269 A1* 9/2006 Suzuki ............... H10D 30/6745 257/E27.113
2009/0301771 A1* 12/2009 Ochi .................... H05K 3/4007 29/879
2012/0286317 A1* 11/2012 Yeh ...................... H10H 20/831 438/22
2012/0298973 A1* 11/2012 Adachi ............ H10K 59/80516 438/46

(Continued)

FOREIGN PATENT DOCUMENTS

JP 2020141102 A 9/2020
WO WO-2019128118 A1 * 7/2019 ......... H01L 25/0753

*Primary Examiner* — Monica D Harrison
*Assistant Examiner* — Jacob T Nelson
(74) *Attorney, Agent, or Firm* — Patterson + Sheridan, LLP

(57) ABSTRACT

A method of manufacturing a semiconductor device is disclosed. The method includes providing a substrate and forming a semiconductor stack on the substrate. The semiconductor stack includes a side surface. The method further includes forming an electrode on the side surface of the semiconductor stack and forming a resin on the electrode. Further, the method includes forming a conductive bump on the electrode.

19 Claims, 18 Drawing Sheets

(56) References Cited

U.S. PATENT DOCUMENTS

| | | | | |
|---|---|---|---|---|
| 2014/0042457 | A1* | 2/2014 | Shibata | H10D 30/675 257/76 |
| 2015/0236230 | A1* | 8/2015 | Miyata | H10H 20/01 438/27 |
| 2018/0060479 | A1 | 3/2018 | Lo et al. | |
| 2018/0254398 | A1 | 9/2018 | Aketa et al. | |
| 2018/0374738 | A1* | 12/2018 | Lee | H10P 72/74 |
| 2020/0227591 | A1 | 7/2020 | Hsieh et al. | |
| 2021/0005588 | A1 | 1/2021 | Chung et al. | |
| 2021/0050478 | A1 | 2/2021 | Su et al. | |
| 2022/0173292 | A1 | 6/2022 | Shen et al. | |

* cited by examiner

SEMICONDUCTOR DEVICE AND MANUFACTURING METHOD THEREOF

RELATED APPLICATION

This application claims the benefit of U.S. Provisional Application Ser. No. 63/262,524, filed on Oct. 14, 2021, Taiwan Patent Application Serial No. 111116290, filed on Apr. 28, 2022, and Taiwan Patent Application Serial No. 111123680, filed on Jun. 24, 2022, which are each incorporated herein by reference in their entireties.

BACKGROUND

Technical Field

The present disclosure relates to a light-emitting device, and, in particular, to a light-emitting device with a conductive bump, and a manufacturing method thereof.

Description of the Related Art

Light-emitting diodes (LEDs) have characteristics of low energy consumption, long lifetime, small volume, rapid response speed, stable optical output, and so on, and have been widely used in lighting and display fields.

As the continuous advancements in LED technology, the brightness of LED die is increasing continuously, and the size of LED die is also gradually being reduced, e.g., to less than 100 μm, 50 μm, or 30 μm. The use of LED dies is no longer limited to general lighting applications or as a backlight source in LCD monitors. Directly using LED dies as the pixels of an LED display could become a trend in next-generation displays.

SUMMARY

An embodiment of the present disclosure provides a semiconductor device comprising a semiconductor stack; a protective layer on the semiconductor stack and having an uppermost surface; an electrode on the semiconductor stack and being electrically connected to the semiconductor stack; and a conductive bump on the electrode and having a convex outermost surface, a top, and a maximum width, wherein a thickness of the conductive bump is defined from the top to the uppermost surface, and a ratio of the thickness to the maximum width is from 0.1 to 0.4.

An embodiment of the present disclosure provides a method of manufacturing a semiconductor device, comprising providing a substrate; forming a semiconductor stack on the substrate; forming an electrode on the semiconductor stack; forming a bonding pad on the electrode; forming a glue material on the bonding pad; and irradiating the bonding pad and the glue material with a laser energy so that the bonding pad being melted to form a conductive bump on the electrode, wherein the conductive bump is covered by the glue material.

DETAILED DESCRIPTION OF THE INVENTION

Figure 1A:
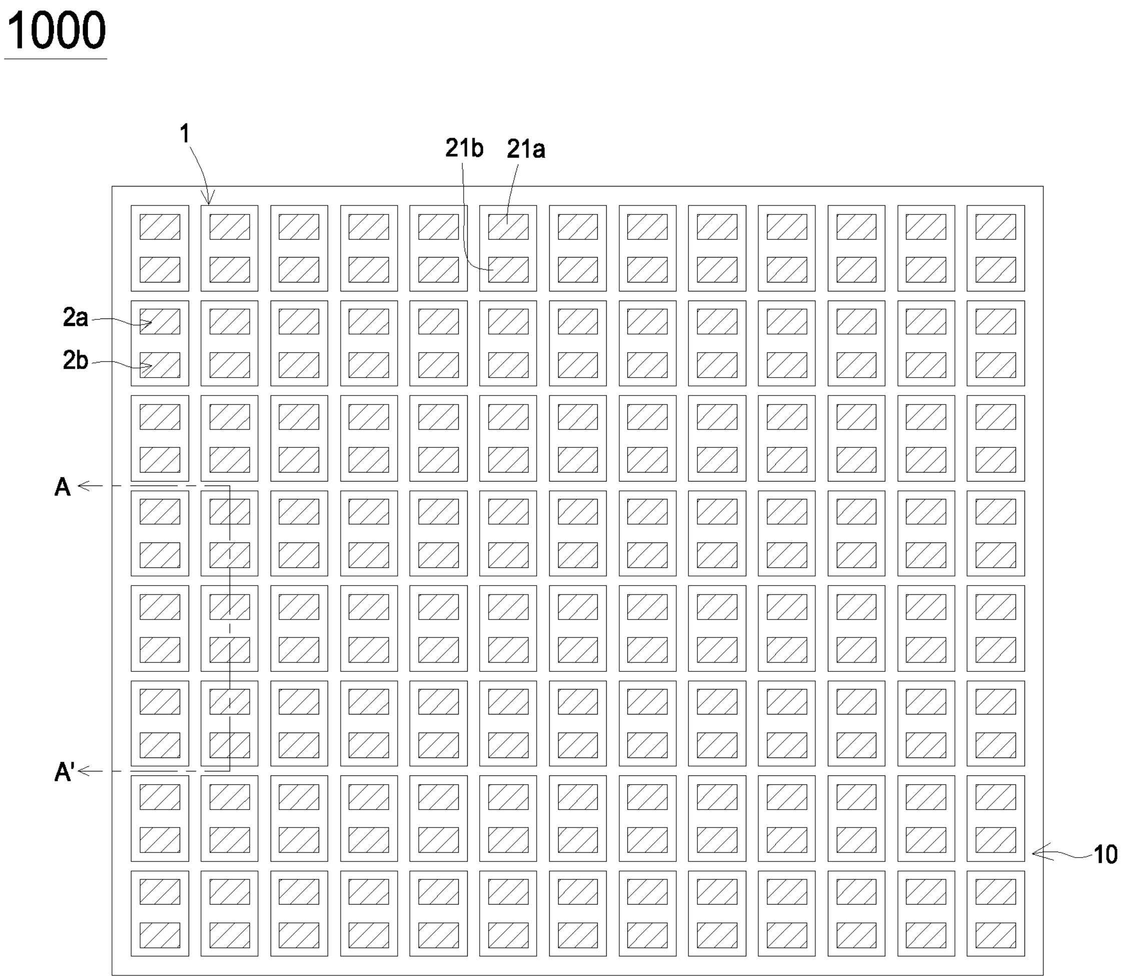
FIG. 1A is a top view of a semiconductor device array in accordance with an embodiment of the present disclosure.

The following embodiments will be described with accompanying figures to illustrate the concept of the present disclosure. In the drawings or the specification, same symbols will be used for the same or similar parts, and the shape, thickness or height of an element in the drawings may be enlarged or reduced within a reasonable scope. Various embodiments exemplified in the present disclosure are merely used for illustrating the present disclosure, instead of limiting the scope of the present disclosure. Any obvious modifications or alterations done to the present disclosure will not depart from the spirit and scope of the present disclosure.

Figure 1B:
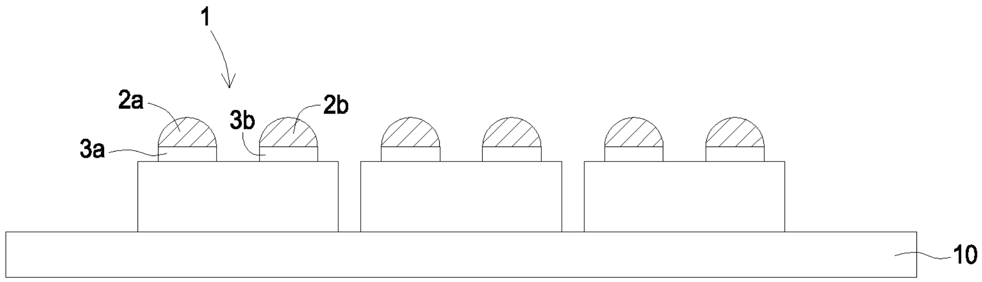
FIG. 1B is a cross-sectional view taken along line A-A' of FIG. 1A.
Figure 3A:
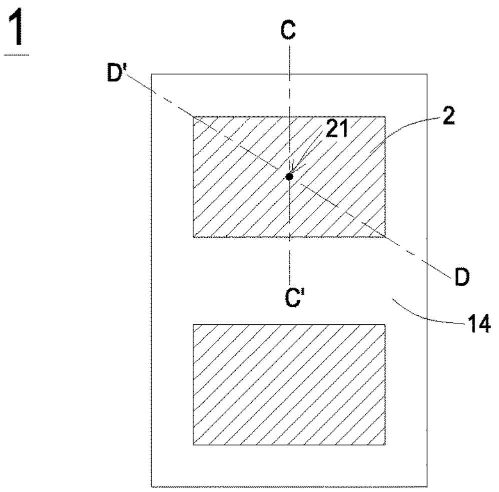
FIG. 3A is a top view of a semiconductor device in accordance with an embodiment of the present disclosure.

FIG. 1A is a top view of a semiconductor device array 1000 in accordance with an embodiment of the present disclosure. The semiconductor device array 1000 includes a plurality of semiconductor devices 1 arranged in an array on a substrate 10. The semiconductor device 1 may be a light-emitting diode (LED), laser diode (LD), or transistor. The semiconductor device array 1000 may be composed of a single type or various types of semiconductor device 1. The substrate 10 can be a growth substrate of the semiconductor device or can be a carrier when the growth substrate is removed. The material of the substrate 10 includes but is not limited to: germanium (Ge), gallium arsenide (GaAs), indium phosphide (InP), sapphire, silicon carbide (SiC), silicon (Si), lithium aluminate ($LiAlO_2$), zinc oxide (ZnO), gallium nitride (GaN), aluminum nitride (AlN), metal, glass, thermal release tape, UV release tape, chemical release tape, heat resistant tape, blue tape, or tapes with dielectric release layer. Each of the semiconductor devices 1 has a pair of conductive bumps 2*a*, 2*b* for electrically or physically connecting to the external circuit (e.g., circuit board, backplane) on the side away from the substrate 10. The projected shape of the conductive bump is substantially rectangular in the top view, as shown in FIGS. 1A and 3A FIG. 1B is a cross-sectional view taken along line A-A' of FIG. 1A. The semiconductor device 1 has a pair of electrodes 3*a*, 3*b* on the side away from the substrate 10. The conductive bumps 2*a*, 2*b* are directly disposed on the electrode 3*a*, 3*b*, respectively. The upper surfaces of the conductive bumps 2*a*, 2*b* are of arc shape and not parallel to the upper surfaces of the electrodes 3*a*, 3*b*.

In one embodiment, the material of the conductive bumps 2*a*, 2*b* is different from the material of the electrodes 3*a*, 3*b*. The material of the electrodes 3*a*, 3*b* includes, such as gold (Au), silver (Ag), copper (Cu), chromium (Cr), aluminum (Al), platinum (Pt), nickel (Ni), titanium (Ti), alloys thereof, or combinations of the stacking layers thereof. The material of the conductive bumps 2*a*, 2*b* may include a low melting point metal or a low liquidus melting point alloy, whose melting point or liquidus temperature is lower than 210° C., such as bismuth (Bi), tin (Sn), indium (In), or alloys thereof. In an embodiment, the melting point of the low melting point metal or the liquidus temperature of the low liquidus melting point alloy is lower than 170° C. The material of the low liquidus melting point alloy may be tin-indium alloy or tin-bismuth alloy.

Figure 1C:
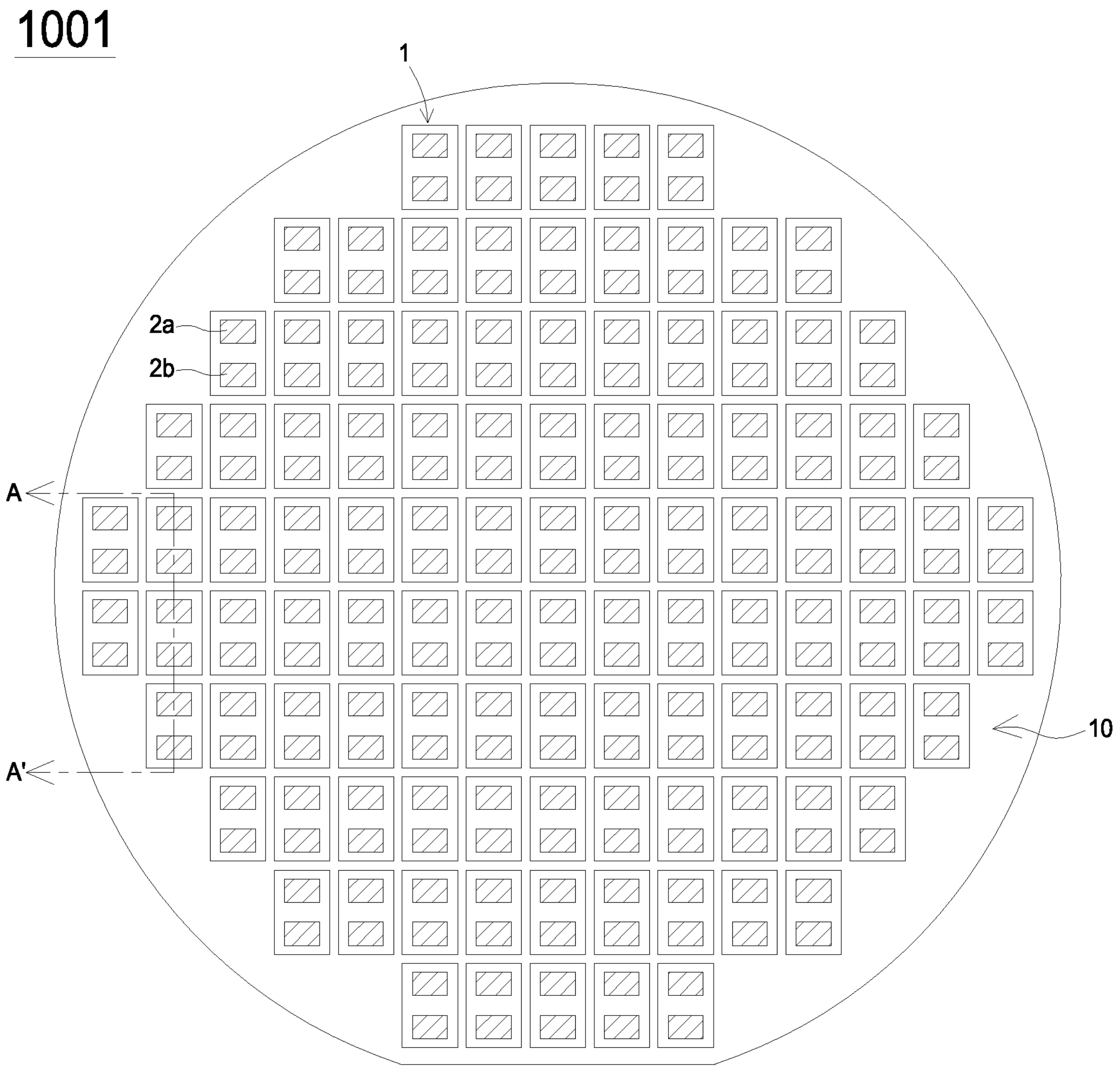
FIG. 1C is a top view of a semiconductor device array in accordance with another embodiment of the present disclosure.
Figure 1D:
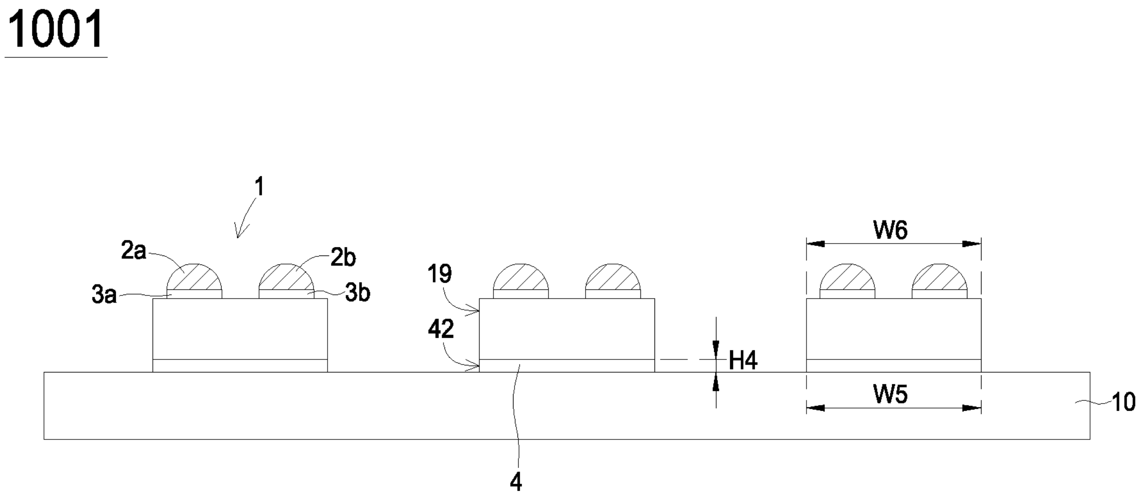
FIG. 1D is a cross-sectional view taken along line A-A' of FIG. 1C.

FIG. 1C is a top view of a semiconductor device array 1001 in accordance with another embodiment of the present disclosure. The semiconductor device array 1001 includes a plurality of semiconductor devices 1 arranged in a predetermined pattern on the substrate 10. The substrate 10 has a substantially circular shape. For the material of the substrate 10, reference can be made to the aforementioned relevant paragraphs. FIG. 1D is a cross-sectional view taken along line A-A' of FIG. 1C. An adhesive structure 4 is between each semiconductor device 1 and the substrate 10. Each of the plurality of semiconductor devices 1 is temporally fixed on the substrate 10 by the adhesive structure 4. Each of the plurality of semiconductor devices 1 has a pair of the electrodes 3*a*, 3*b* on the side away from the substrate 10. The conductive bumps 2*a*, 2*b* are directly disposed on the electrodes 3*a*, 3*b*, respectively. The upper surfaces of the conductive bumps 2*a*, 2*b* are of arc shape from the lateral view and not completely parallel to the upper surfaces of the electrodes 3*a*, 3*b*. The adhesive structure 4 may include polymer, such as polyimide or benzocyclobutane (BCB). For the material of the conductive bumps 2*a*, 2*b* and the material of the electrodes 3*a*, 3*b*, reference can be made to the aforementioned relevant paragraphs. As shown in FIG. 1D, for each semiconductor device 1, an outer side 42 of the adhesive structure 4 is substantially co-planar with an outermost side 19 of the semiconductor device 1. The adhesive portion 4 has a thickness H4, which is about 2-3 m or 1-10 m. In another embodiment, for each of the semiconductor devices 1, the outer side 42 is not co-planar with the outermost side 19 of the semiconductor device 1, and the adhesive structure 4 can be retracted or protruded relative to the outermost side 19 of the semiconductor device 1. The adhesive structure 4 has a maximum width W5 and the semiconductor device 1 has a maximum width W6, and the maximum width W5 is substantially equal to the maximum width W6. In another embodiment, the maximum width W5 can be less than or more than the maximum width W6.

Figure 1E:
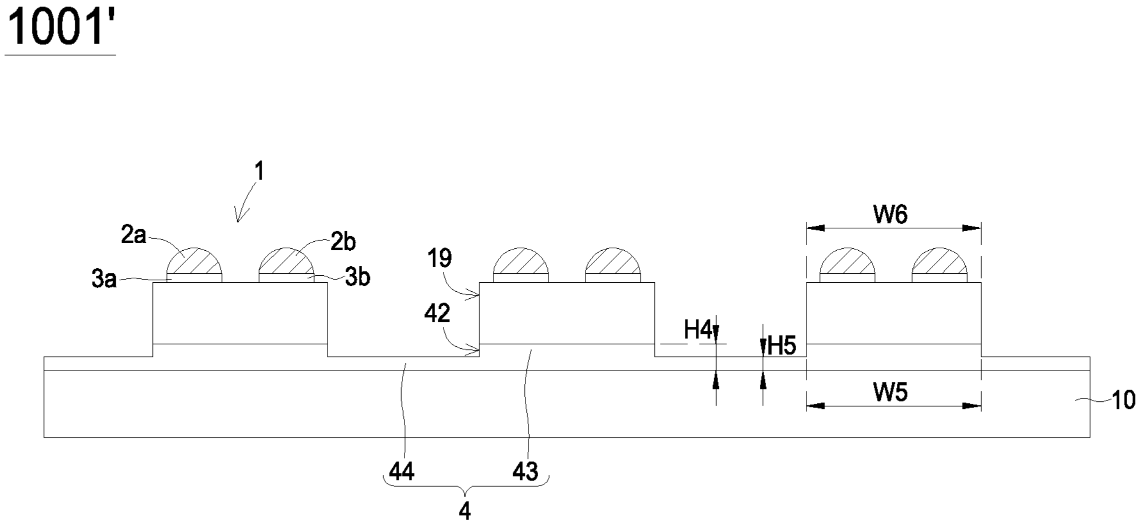
FIG. 1E is a cross-sectional view of a semiconductor device array in accordance with another embodiment of the present disclosure.

FIG. 1E is a cross-sectional view of the semiconductor device array 1001' in accordance with another embodiment of the present disclosure. The semiconductor device array 1001' includes a plurality of semiconductor devices 1 arranged in a predetermined pattern on a substrate 10. For the material of the substrate 10, reference can be made to the aforementioned relevant paragraphs. An adhesive structure 4 is between the plurality of semiconductor devices 1 and the substrate 10. The plurality of semiconductor devices 1 is temporarily fixed on the substrate 10 by the adhesive structure 4. Each semiconductor device 1 has a pair of the electrodes 3*a*, 3*b* on the side away from the substrate 10. The conductive bumps 2*a*, 2*b* are directly disposed on the electrodes 3*a*, 3*b*, respectively. For the material of the adhesive structure 4, the structure and material of the conductive bumps 2*a*, 2*b*, and the structure and material of the electrodes 3*a*, 3*b*, references can be made to the aforementioned relevant paragraphs. As shown in FIG. 1E, the adhesive structure 4 has mesa portions 43 and continuous portions 44. The continuous portions 44 are uninterrupted and continuously disposed on the substrate 10 across the areas below the plurality of semiconductor devices 1 and between two adjacent semiconductor devices 1. Each of the mesa portions 43 is between each of the semiconductor devices 1 and the continuous portions 44, protruding from the continuous portion 44 and corresponding to one of the plurality of semiconductor devices 1. For each of the plurality of semiconductor devices 1, the outer side 42 of the mesa portion 43 is co-planar with or near the outermost side 19 of the semiconductor device 1. The adhesive portion 4 has a thickness H4, which is about 2-3 μm. The continuous portion 44 has a thickness H5, which is more than 0 μm and less than 1 μm. In another embodiment, for each semiconductor device 1, the outer side 42 is not co-planar with the outermost side 19 of the semiconductor device 1, and the mesa portion 43 can be retracted or protruded relative to the outermost side 19 of the semiconductor device 1. The mesa portion 43 has a maximum width W5 and the semiconductor device 1 has a maximum width W6, and the maximum width W5 is substantially equal to the maximum width W6. In another embodiment, the maximum width W5 may be less than or more than the maximum width W6.

Figure 2A:
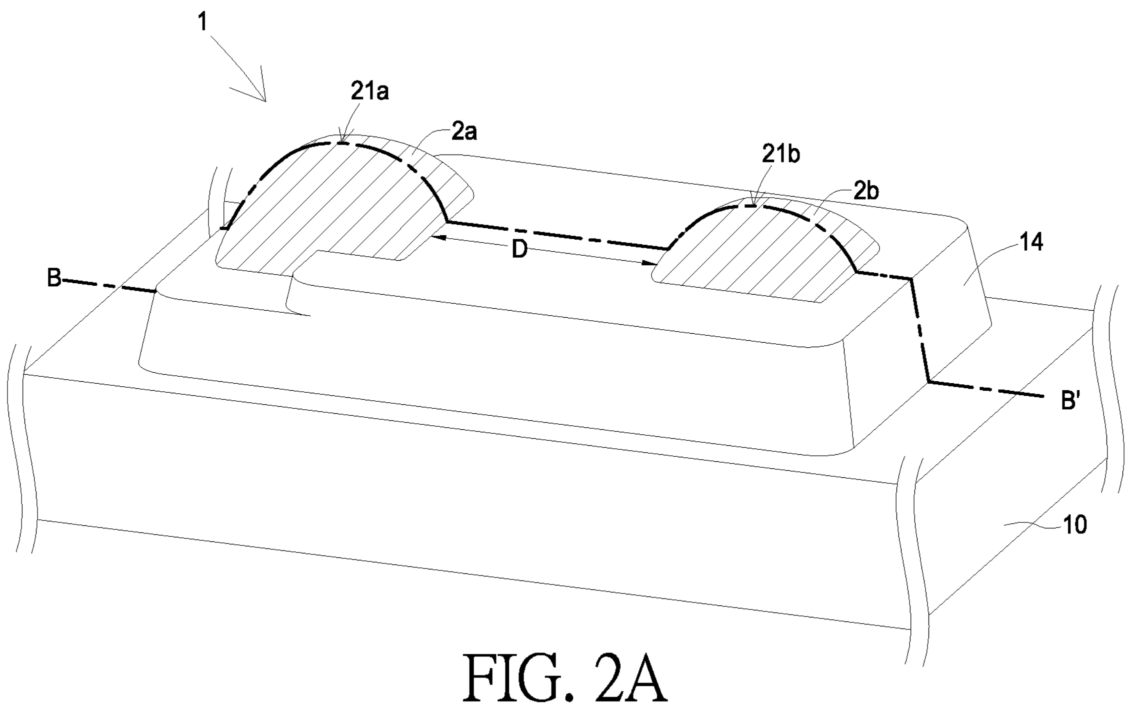
FIG. 2A is a three-dimensional view of a semiconductor device in accordance with an embodiment of the present disclosure.

FIG. 2A is a three-dimensional view of a semiconductor device 1 on a substrate 10 in accordance with an embodiment of the present disclosure. The maximum side length of the semiconductor device 1 is not more than 100 m or 50 m. For example, the maximum side length of the semiconductor device is about 40 m and the width thereof is about 20 m. The conductive bump 2*a* and the conductive bump 2*b* have opposite polarities (positive, negative), and the minimal horizontal distance D therebetween is less than 40 m. For example, the maximum side length of the semiconductor device 1 is about 40 m and the distance D thereof is about 15 m. The conductive bumps 2*a*, 2*b* completely cover the electrode (such as the electrodes 3*a*, 3*b* in FIG. 1B) and have convex arc shapes and tops 21*a*, 21*b*. Referring to FIG. 1A, the tops 21*a*, 21*b* are located approximately at the geometric center of the conductive bumps 2*a*, 2*b* and/or the electrodes.

Figure 2B:
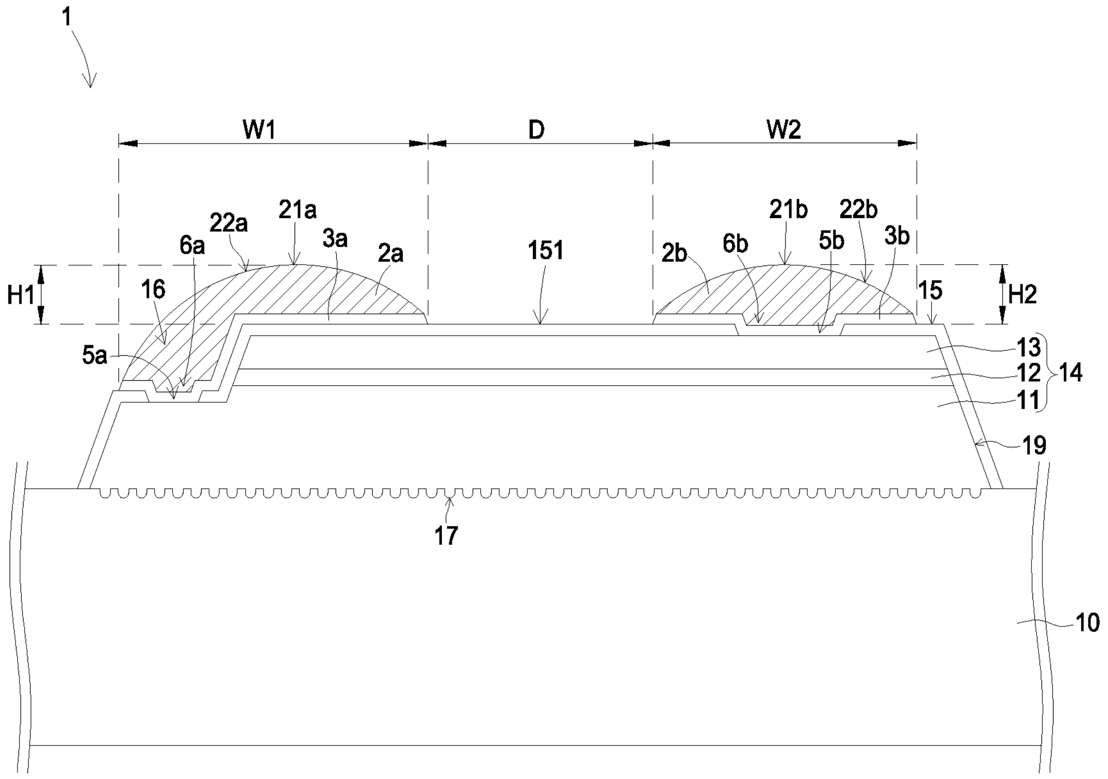
FIG. 2B is a cross-sectional view of a semiconductor device taken along line B-B' of FIG. 2A.

FIG. 2B is a cross-sectional view of a semiconductor device 1 taken along line B-B' of FIG. 2A. The semiconductor device 1 is placed on the substrate 10, and has a semiconductor stack 14, a protective layer 15, a first electrode 3*a*, a second electrode 3*b*, a first conductive bump 2*a*, and a second conductive bump 2*b*. The outermost side 19 of the semiconductor stack 14 is an inclined plane, which is inclined with respect to the substrate 10. The semiconductor stack 14 includes a first semiconductor layer 11, an active layer 12, and a second semiconductor layer 13. The first semiconductor layer 11 and the second semiconductor layer 13 can respectively provide electrons and holes so that the electrons and holes can recombine in the active layer 12 to emit light. The first semiconductor layer 11, the active layer 12 and the second semiconductor layer 13 may include III-V semiconductor material, such as $Al_xIn_yGa_{(1-x-y)}$ N or $Al_xIn_yGa_{(1-x-y)}P$, wherein $0 \le x, y \le 1$; $(x+y) \le 1$. Depending on the material of the semiconductor stack 14, the active layer 12 can emit a red light with a peak wavelength in a range of 610 nm and 650 nm, a green light with a peak wavelength in a range of 530 nm and 570 nm, a cyan light with a peak wavelength in a range of 500 nm and 485 nm, a blue light with a peak between 450 nm and 490 nm, a violet light with a peak wavelength in a range of 400 nm and 450 nm, or an ultraviolet light with a peak wavelength in a range of 280 nm and 400 nm. The maximum thickness of the semiconductor stack 14 is about equal to or less than 10 μm. In an embodiment, the lower surface 17 of the first semiconductor layer 11 is a rough surface and in contact with the substrate 10. In another embodiment, the lower surface 17 of the first semiconductor layer 11 is a substantially flat surface (not shown). In another embodiment, the substrate 10 is a growth substrate for epitaxial growth of the semiconductor stack 14 and can be a patterned sapphire substrate (PSS) so the entire upper surface of the substrate 10 facing the semiconductor stack 14 is a rough surface (not shown). In an embodiment, the semiconductor device 1 includes a carrier (not shown) under the semiconductor stack 14 to support the semiconductor stack 14, and the carrier may be an epitaxial growth substrate of the semiconductor stack 14 or not an epitaxial growth substrate. For the material of the carrier, reference can be made to the aforementioned relevant paragraphs of the substrate 10, but the selection of materials should conform to the theoretical and practical feasibility.

The semiconductor stack 14 has a mesa 16 which is formed by removing a portion of the active layer 12 and the second semiconductor layer 13 to expose the first semiconductor layer 11. The protective layer 15 covers the upper surface of the second semiconductor layer 13, sidewalls of the first semiconductor layer 11, sidewalls of the active layer 12, sidewalls of the second semiconductor layer 13, and the upper surface of the first semiconductor layer 11 in the mesa 16. The protective layer 15 can directly contact the substrate 10. In another embodiment, the protective layer 15 is not in contact with the substrate 10. The protective layer 15 has a first opening 5*a* in the mesa 16 to expose portions of the first semiconductor stack 11. The protective layer 15 has a second opening 5*b* on the second semiconductor layer 13 to expose portions of the second semiconductor layer 13. The first electrode 3*a* is in the mesa 16, wherein the first electrode 3*a* has a portion formed on the protective layer 15 and covers the protective layer 15 in and outside of the mesa 16. The first electrode 3*a* has a first recess 6*a* formed in the first opening 5*a* and is electrically connected to the first semiconductor layer 11. The first electrode 3*a* has a stepped shape at the position of the mesa 16. The second electrode 3*b* has a portion on the protective layer 15 outside the second opening 5*b* and a second recess 6*b* formed in the second opening 5*b* for being electrically connected to the second semiconductor layer 13.

The protective layer 15 may be a single-layer or multi-layers structure and has a property of electrical insulation. The material of the single-layer structure may include oxide, nitride, or polymer. The oxide may include aluminum oxide ($Al_2O_3$), silicon oxide ($SiO_2$), titanium oxide ($TiO_2$), tantalum pentoxide ($Ta_2O_5$), or aluminum oxide ($AlO_x$). The nitride may include aluminum nitride (AlN) or silicon nitride ($SiN_x$). The polymer may include polyimide or benzocyclobutane (BCB). The material of the multi-layers structure may include aluminum oxide ($Al_2O_3$), silicon oxide ($SiO_2$), titanium oxide ($TiO_2$), niobium pentoxide ($Nb_2O_5$), silicon nitride ($SiN_x$), or combinations thereof. The multi-layers structure can also form a distributed Bragg reflector (DBR).

Referring to FIG. 2B, a first conductive bump 2*a* is directly formed over the first electrode 3*a*. The first conductive bump 2*a* may completely or partially fill the first recess 6*a* of the first electrode 3*a*, and the outermost surface 22*a* of the first conductive bump 2*a* has a macroscopically smooth and convex arc shape. The first conductive bump 2*a* has a top 21*a*, which is a region having farthest distance between the first conductive bump 2*a* and the substrate 10. As shown in FIG. 2B, the outermost surface 22*a* of the first conductive bump 2*a* is not parallel to the lowest surface of the first conductive bump 2*a*, and is not parallel to the upper surface of the first electrode 3*a*, either. The lower surface 17 of the first semiconductor layer 11 is a rough surface, wherein the roughness of the outermost surface 22*a* of the first conductive bump 2*a* is less than the roughness of the lower surface 17 of the first semiconductor layer 11 and is less than the roughness of the upper surface of the first electrode 3*a*.

Referring to FIG. 2B, a second conductive bump 2*b* directly covers the second electrode 3*b*. The second conductive bump 2*b* may completely or partially fill the second recess 6*b* of the second electrode 3*b*, and the outermost surface 22*b* of the second conductive bump 2*b* has a macroscopically smooth and convex arc shape. The second conductive bump 2*b* has a top 21*b*, which is a region of the second conductive bump 2*b* farthest away from the substrate 10. As shown in the FIG. 2B, the outermost surface 22*b* of the second conductive bump 2*b* is not parallel to the lowest surface of the second conductive bump 2*b*, and is not parallel to the upper surface of the second electrode 3*b*, either. The roughness of the outermost surface 22*b* of the second conductive bump 2*a* is less than the roughness of the lower surface 17 of the first semiconductor layer 11 and is less than the roughness of the upper surface of the second electrode 3*b*. Preferably, the top 21*a* of the first conductive bump 2*a* and the top 21*b* of the second conductive bump 2*b* are substantially in a same level height, which is beneficial for the device 1 to be stably affixed on the substrate subsequently. However, in practice, there may be a certain degree of high difference under the tolerance of the fabrication process. Generally, the lowest surface of the first conductive bump 2*a* and the second conductive bump 2*b* are formed conformally on the first electrode 3*a* and the second electrode 3*b*, respectively, whereas their lowest points are not commonly in the same level height. As shown in FIG. 2B, a first thickness H1 can be obtained by measuring the vertical distance from the top 21*a* of the first conductive bump 2*a* to the uppermost surface 151 of the protective layer 15. The first conductive bump 2*a* has a first (maximum) width W1, wherein the ratio H1/W1 is between 0.1~0.4, preferably between 0.1~0.25. A second thickness H2 can be obtained by measuring the vertical distance from the top 21*b* of the second conductive bump 2*n* to the uppermost surface 151 of the protective layer 15. The second conductive bump 2*b* has a second (maximum) width W2, wherein the ratio H2/W2 is between 0.1~0.4, preferably between 0.1~0.25. The ratios of H1/W1 and H2/W2 may be the same or different. The second thickness H2 of the second conductive bump 2*b* is between 4~6 μm.

If the first conductive bump 2*a* is more densely filled in the first recess 6*a* of the first electrode 3*a* and/or the second conductive bump 2*b* is more densely filled in the second recess 6*b* of the second electrode 3*b*, the reliability of the physical or electrical connection between the semiconductor device 1 and the circuit substrate (not shown) can be improved, and the probability of open circuit between the semiconductor device 1 and the circuit substrate can be reduced. Specifically, if the structure of the semiconductor device 1 is as shown in FIG. 2B but does not have the conductive bump 2*a*/2*b*, when the semiconductor device 1 is fixed to a circuit substrate by a solder, the solder between the first electrode 3*a* and the circuit substrate (not shown) may sometimes have holes near the first recess 6*a*, and the solder between the second electrode 3*b* and the circuit substrate (not shown) also may sometimes have holes near the second recess 6*b*. These holes may decrease the fixing strength between the semiconductor device 1 and the circuit substrate.

Figure 2C:
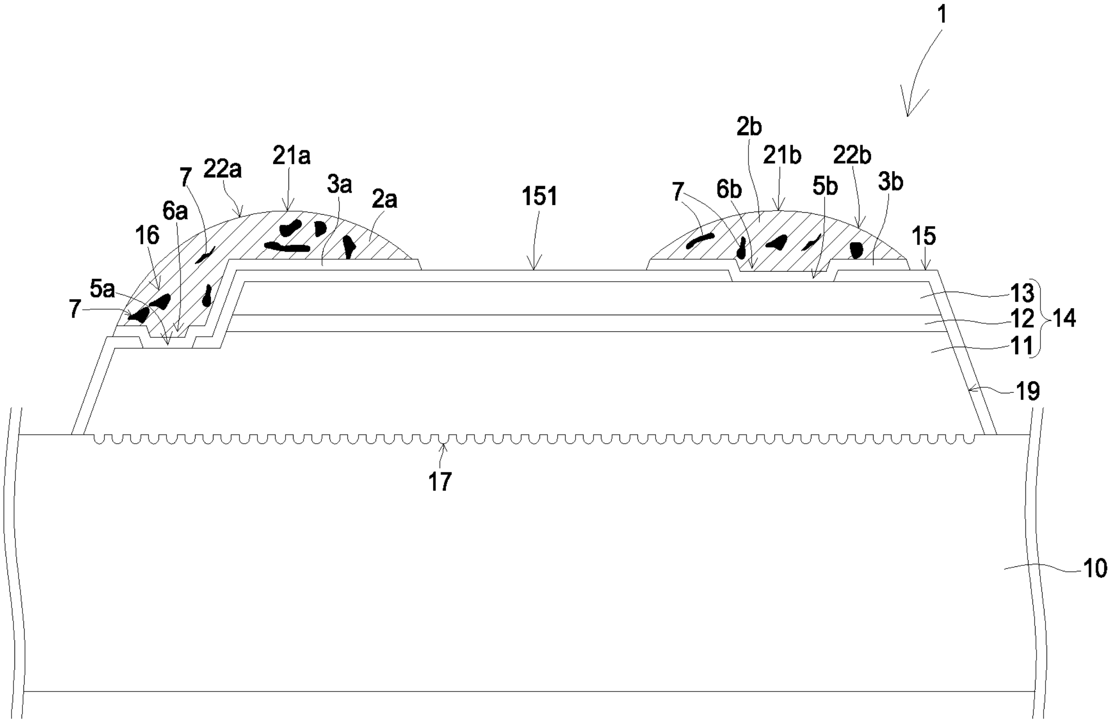
FIG. 2C is a cross-sectional view of a semiconductor device in accordance with another embodiment of the present disclosure.

If a thermal treatment step is present during the formation of the conductive bump, under a specific combination of the selected materials of the conductive bump and the electrode, discretely distributed metal particles may be formed within the conductive bump after the thermal treatment step, as shown in FIG. 2C. FIG. 2C is a cross-sectional view of a semiconductor device 1 in accordance with another embodiment of the present disclosure. For the structure shown in FIG. 2C, reference can be made to FIG. 2B and the aforementioned relevant paragraphs. The first conductive bump 2*a* and the second conductive bump 2*b* have discretely distributed, irregularly sized and irregularly shaped particles 7 distributed therein. The material of the particles 7 is different from the material of the conductive bump 2*a*, 2*b*, but is partially the same as the material of the electrode 3*a*, 3*b*, such as gold, platinum, and alloy thereof. The shape of particles 7 may be bar shape, polygon, leaf shape, or teardrop shape.

Figure 2D:
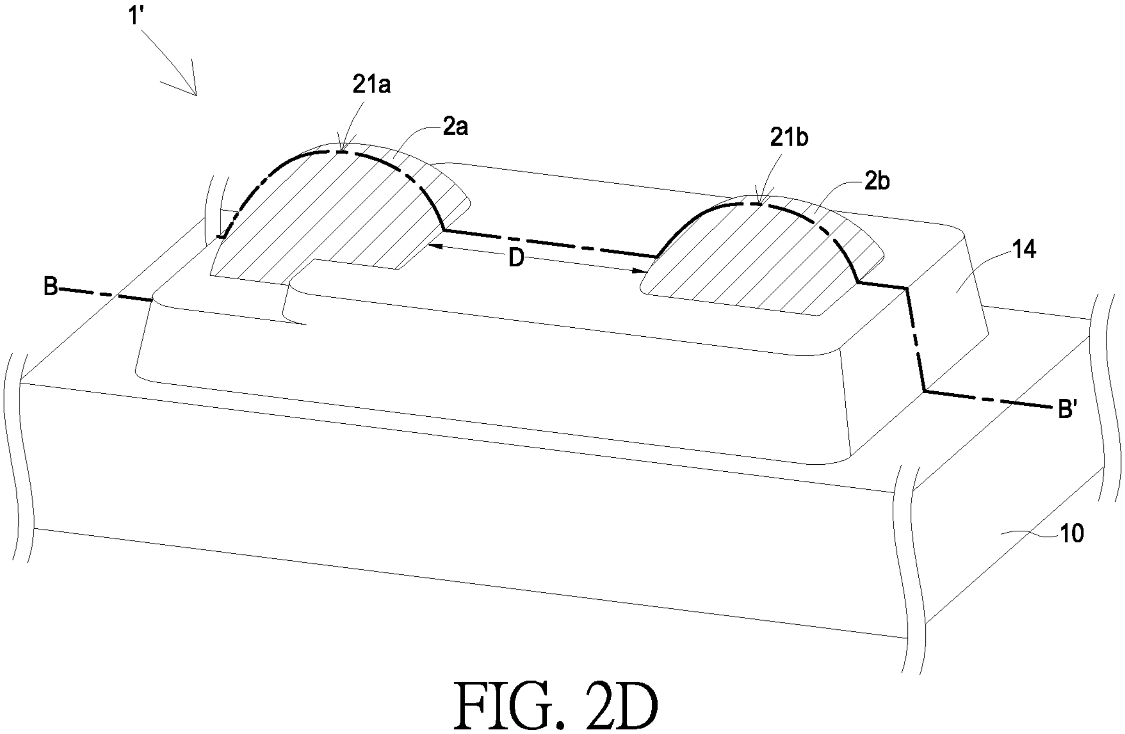
FIG. 2D is a three-dimensional view of a semiconductor device in accordance with another embodiment of the present disclosure.
Figure 2E:
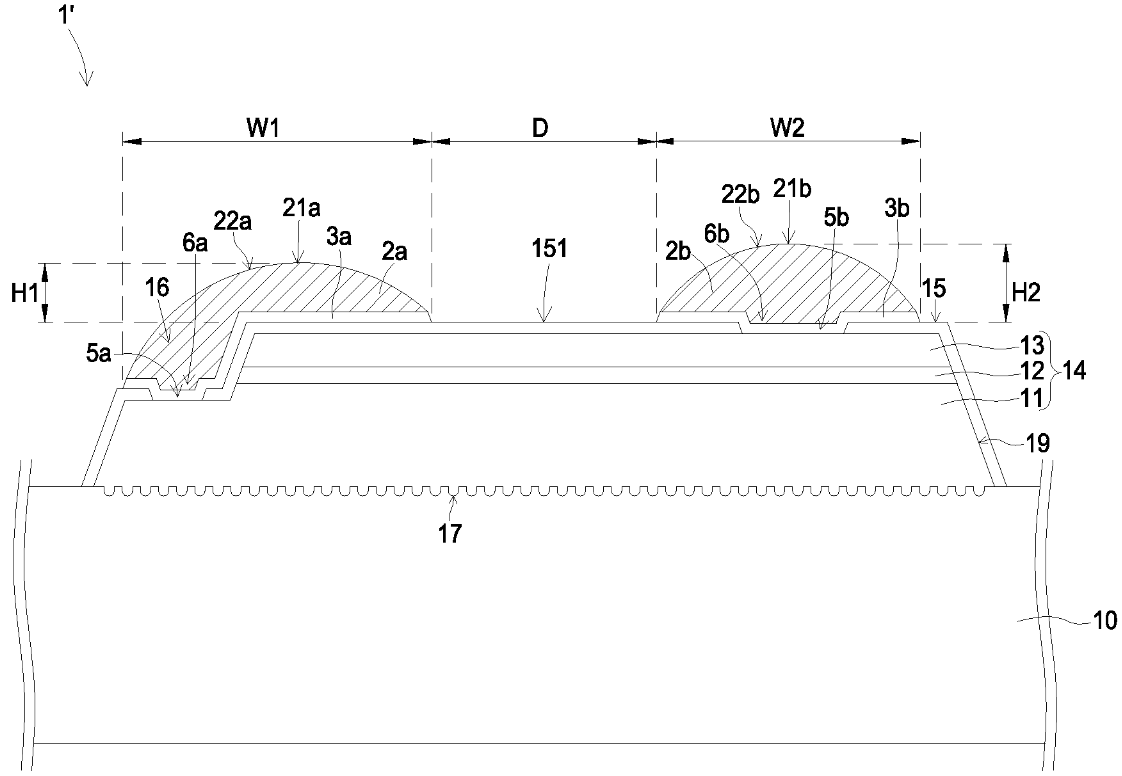
FIG. 2E is a cross-sectional view of a semiconductor device taken along line B-B' of FIG. 2D.

FIGS. 2D-2E are schematic views of a semiconductor device 1' in accordance with another embodiment of the present disclosure. For the structure of FIGS. 2D-2E, reference can be made to FIGS. 2A-2B and the aforementioned relevant paragraphs. As shown in FIG. 2D, the conductive bumps 2*a*, 2*b* have convex arc shapes and tops 21*a*, 21*b*. The top 21*a* and top 21*b* are not in the same level height. The top 21*a* is slightly lower than the top 21*b*. FIG. 2E is a cross-sectional view of a semiconductor device 1' taken along line B-B' of FIG. 2D. The conductive bump 2*a* is above the mesa 16. When the volume of the conductive bump 2*a* is similar to that of the conductive bump 2*b*, because a portion of the conductive bump 2*a* fills the mesa 16, the top 21*a* of the conductive bump 2*a* is slightly lower than the top 21*b* of the conductive bump 2*b*. In an embodiment, the first thickness H1 of the first conductive bump 2*a* is 0.4 to 1 m less than the second thickness H2 of the second conductive bump 2*b*. In another embodiment, the first thickness H1 of the first conductive bump 2*a* is the same as or larger than the second thickness H2 of the second conductive bump 2*b*.

Figure 3B:
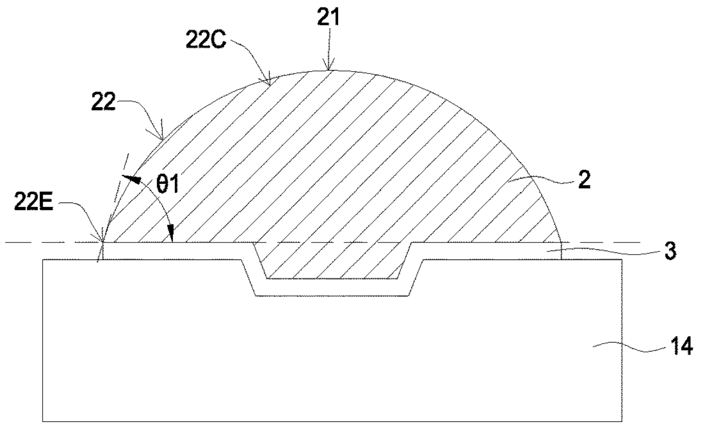
FIG. 3B is a cross-sectional view of a semiconductor device taken along line C-C' of FIG. 3A.
Figure 3C:
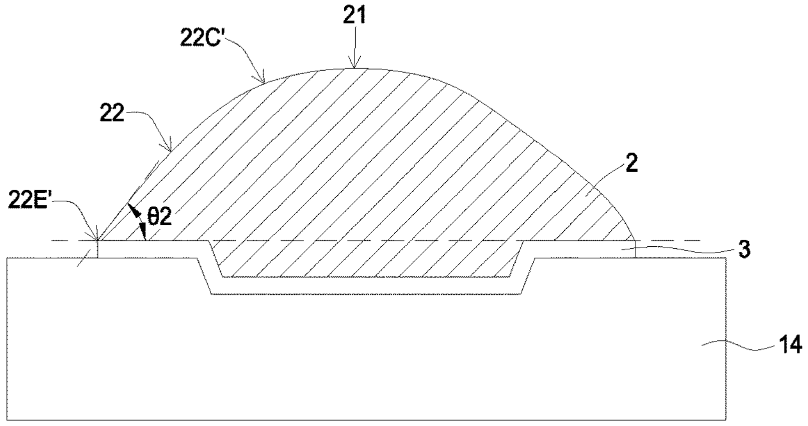
FIG. 3C is a cross-sectional view of a semiconductor device taken along line D-D' of FIG. 3A.

FIG. 3A is a top view of a semiconductor device 1 in accordance to an embodiment of the present disclosure. FIG. 3B is a cross-sectional view of a semiconductor device 1 taken along line C-C' of FIG. 3A. FIG. 3C is a cross-sectional view of a semiconductor device 1 taken along line D-D' of FIG. 3A. The semiconductor device 1 includes a semiconductor stack 14 and an electrode 3 as well as a conductive bump 2 on the semiconductor stack 14. The projected shape of the conductive bump 2 and the electrode 3 in FIG. 3A is substantially a rectangle. The outermost surface 22 of the conductive bump 2 has a macroscopically smooth and convex arc shape in the cross-sectional view. As shown in FIG. 3B, a cross-sectional view of the outermost surface 22 is a curve 22C, and the curve 22C has an endpoint 22E in contact with the upper surface of the electrode 3, and a tangent line of the curve 22C at the endpoint 22E form an angle θ1 with respect to the upper surface of the electrode 3. The angle θ1 is $70° < θ1 < 90°$. As shown in FIG. 3C, another cross-sectional view of the outermost surface 22 is a curve 22C', and the curve 22C' has an endpoint 22E' in contact with the upper surface of the electrode 3, and a tangent line of the curve 22C' at the endpoint 22E' form an angle θ2 with respect to the upper surface of the electrode 3. Angle θ2 is smaller than angle θ1 and is preferably $30° < θ2 < 70°$. In other words, as shown in FIG. 3A, the cross-sectional shape of the conductive bump 2 in a direction that is parallel to the side length of the electrode is not equal to a cross-sectional shape of the conductive bump in a direction of a diagonal line D-D' of the electrode 3.

Figure 4A:
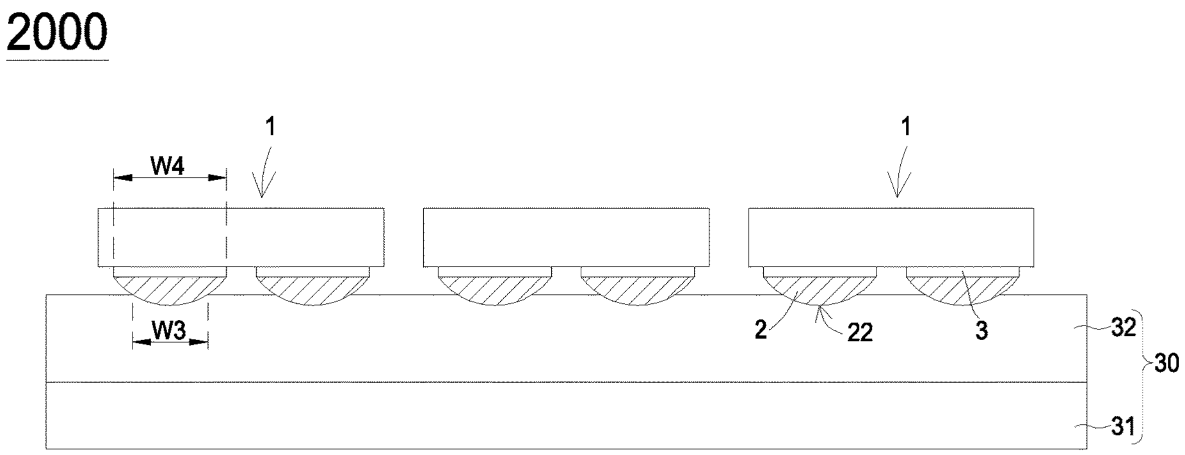
FIG. 4A is a cross-sectional view of a semiconductor device array in accordance with an embodiment of the present disclosure.

FIG. 4A shows a semiconductor device array 2000 in accordance with an embodiment of the present disclosure. The semiconductor device array 2000 includes a plurality of semiconductor devices 1 and a carrier 30. For simplicity, only three of the semiconductor devices 1 in one dimension are shown in FIG. 4A, but the semiconductor device array 2000 may include m*n numbers of the semiconductor devices 1, wherein m, n are integers greater than or equal to 0, and m and n are not 0 at the same time. The semiconductor devices 1 are disposed on the carrier 30 in a way that the conductive bumps 2 facing the carrier 30 (or called "flip-chip"). The carrier 30 may support and fix the semiconductor device 1. The carrier 30 includes a carrier plate 31 and an adhesion layer 32, wherein the material of the carrier plate 31 may be a light-transmitting material that can be transmitted by a light with a specific wavelength emitted by the LED or laser diode (LD), such as glass, sapphire, or polymer material. The adhesion layer 32 may include a thermal release tape, UV release tape, chemical release tape, heat resistant tape, blue tape, or tapes with dielectric release layer. In another embodiment, the adhesion layer 32 may also include a polymer, such as a polyimide and benzocyclobutane (BCB). When the semiconductor devices 1 are arranged on the carrier 30 in the direction of "flip chip", the smooth and convex outermost surfaces 22 of the conductive bumps 2 are in direct contact with the adhesion layer 32. As shown in the FIG. 4A, the conductive bumps 2 may be partially embedded in the adhesion layer 32. The embedded portion of each of the conductive bumps 2 has a maximum width W3 parallel to the surface of the adhesion layer 32, and the conductive bump 2 has a maximum width W4, wherein W4>W3. Besides, the outermost surface 22 of each of the conductive bumps 2 is smooth and arc-shaped, and, in a selected projection direction, the projected area of the portion of each of the conductive bumps 2 embedded in the adhesion layer (such as the area of the indentation 34 in FIG. 4C) is less than the area of the electrode 3 and has a lower adhesive force, which is beneficial for the subsequent transferring process for transferring the semiconductor devices 1 from the carrier 30 to another location. The transferring process of the semiconductor devices 1 will be described in the paragraphs below.

Figure 4B:
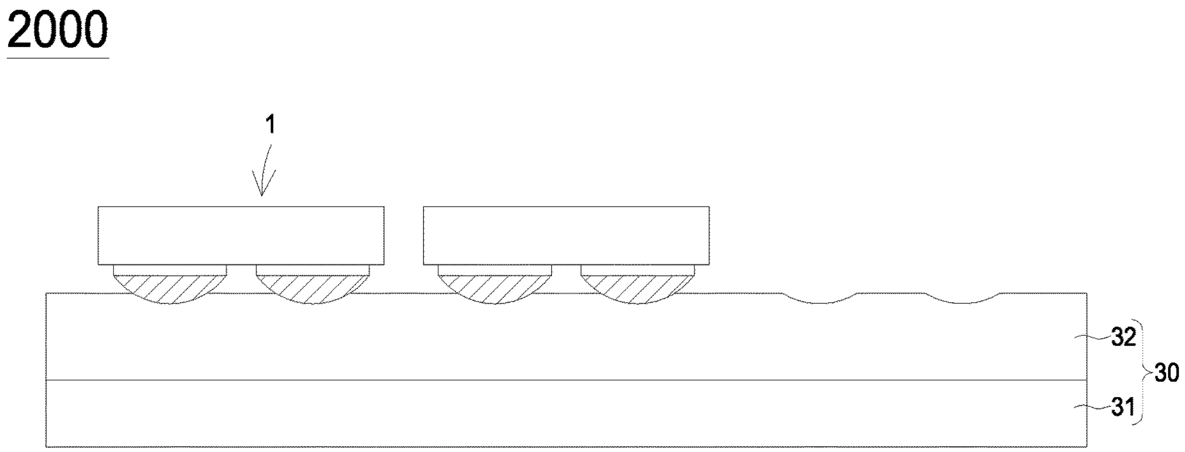
FIG. 4B is a cross-sectional view of a semiconductor device array of FIG. 4A after removing one semiconductor device.
Figure 4C:
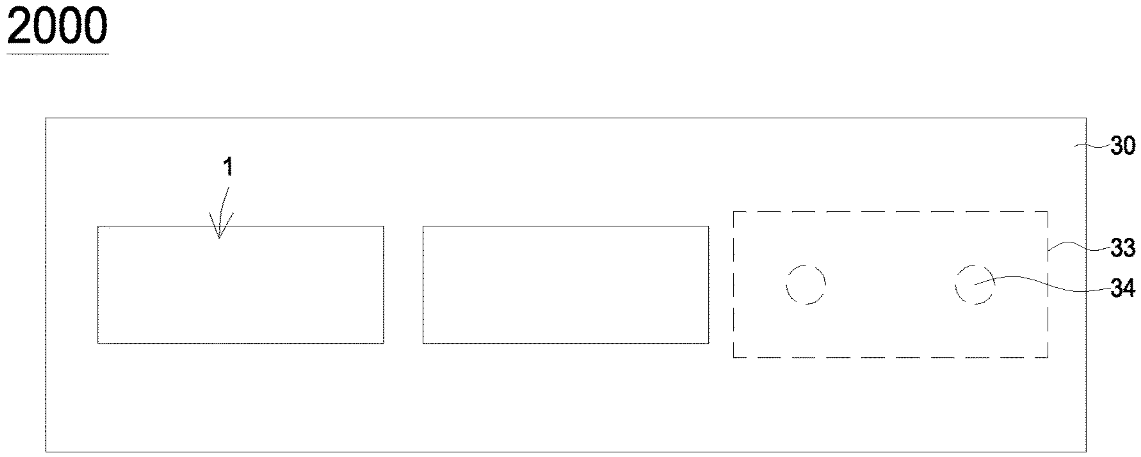
FIG. 4C is a top view of a semiconductor device array of FIG. 4A after removing one semiconductor device.

FIGS. 4B and 4C show a side view and a top view of a semiconductor device array 2000 of FIG. 4A after removing one semiconductor device 1. Referring to FIG. 4C, in the top view, the upper surface of the carrier 30 can define a removal area 33 (as in dotted line), representing an exposed region on the carrier 30 after removing a semiconductor device 1. An indentation 34 is included in the removal area 33. The indentation 34 is a region, which is pressed by the conductive bump 2, of the adhesion layer 32, and the indentation 34 has a projected area in the top view. According to the experimental results, when the ratio of the projected area of the indentation 34 to the projected area of the semiconductor device 1 is less than 0.2, it is easier to pick up the semiconductor device 1 from the carrier 30 and move it to another location.

Figure 4D:
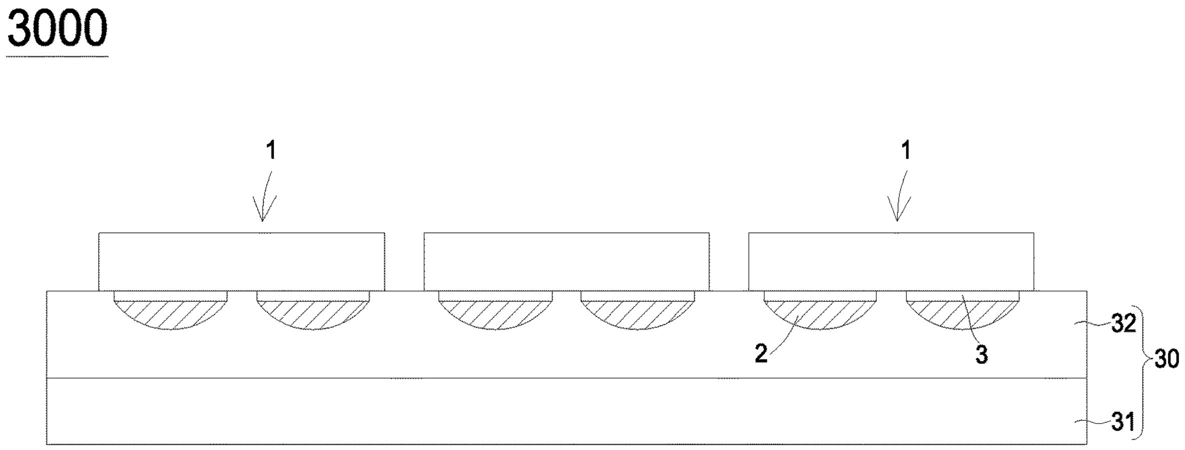
FIG. 4D is a cross-sectional view of a semiconductor device array in accordance with another embodiment of the present disclosure.
Figure 4E:
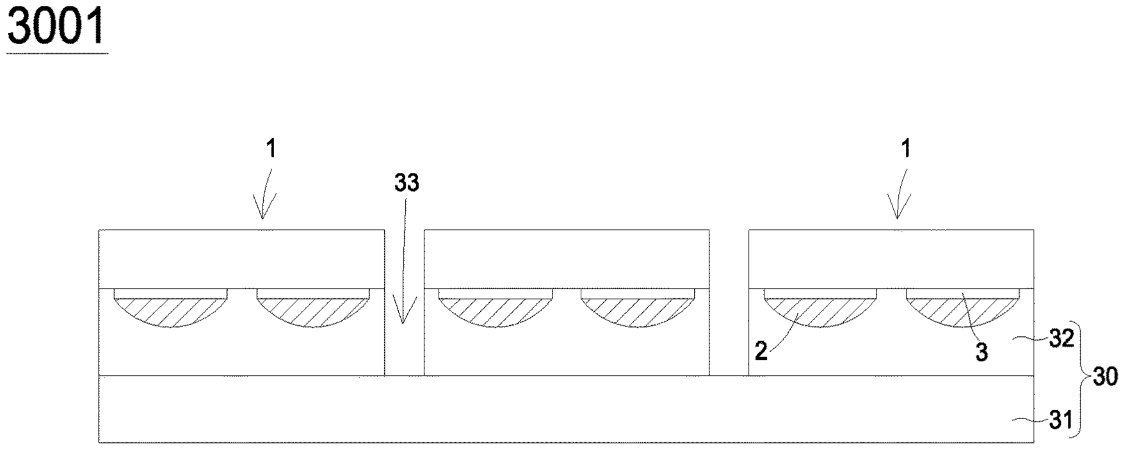
FIG. 4E is a cross-sectional view of a semiconductor device array in accordance with another embodiment of the present disclosure.

FIGS. 4D-4E show a semiconductor device array in accordance with another embodiment of the present disclosure. FIG. 4D shows a semiconductor device array 3000. For the semiconductor device array 3000, reference can be made to FIG. 4A and the aforementioned relevant paragraphs. The semiconductor device array 3000 includes a plurality of semiconductor devices 1 and a carrier 30. The carrier 30 includes a carrier plate 31 and an adhesion layer 32. The plurality of semiconductor devices 1 is disposed on the carrier 30 in a way that the conductive bumps 2 facing the carrier 30. The conductive bumps 2 and the electrodes 3 are completely embedded in the adhesion layer 32 and are completely wrapped by the adhesion layer 32. The adhesion layer 32 covers the lower surface of the semiconductor device 1 which is not covered by the electrode 3. By being temporarily fixed onto the adhesive layer 32, the positions of the semiconductor devices 1 on the carrier 30 can be maintained and are not easy to be changed during the subsequent processes. FIG. 4E shows a semiconductor device array 3001. For the semiconductor device array 3001, reference can be made to FIG. 4D and the aforementioned relevant paragraphs. The semiconductor device array 3001 includes a plurality of semiconductor devices 1 and a carrier 30. The carrier 30 includes a carrier plate 31 and a plurality of adhesion layers 32 separated from each other, and the horizontal position and width of an adhesion layer 32 are corresponded to a semiconductor device 1. An aisle 33 with a width greater than 0 is between two adjacent adhesion layers 32. The plurality of semiconductor devices 1 is disposed on the carrier 30 in such a way that the conductive bump 2 facing the carrier 30. The conductive bump 2 and the electrode 3 are completely embedded in the adhesion layer 32 and are completely wrapped by the adhesion layer 32. The adhesion layer 32 covers the lower surface of the semiconductor device 1 which is not covered by the electrode 3.

Figure 5A:
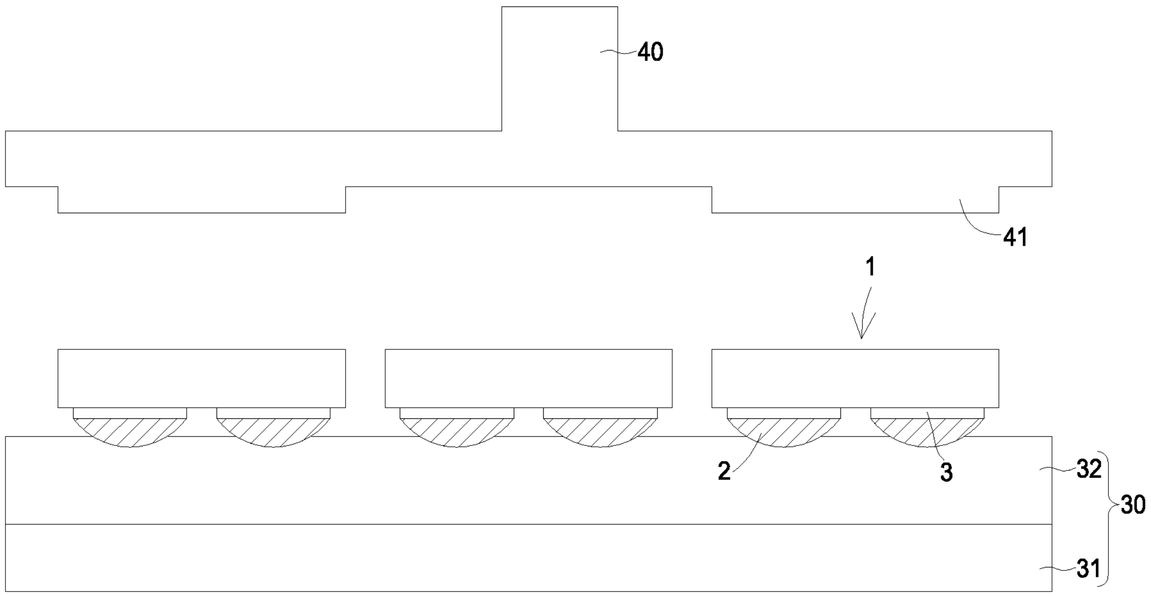
FIGS. 5A-5D are schematic views of various stages for transferring semiconductor devices in accordance with an embodiment of the present disclosure.
Figure 5B:
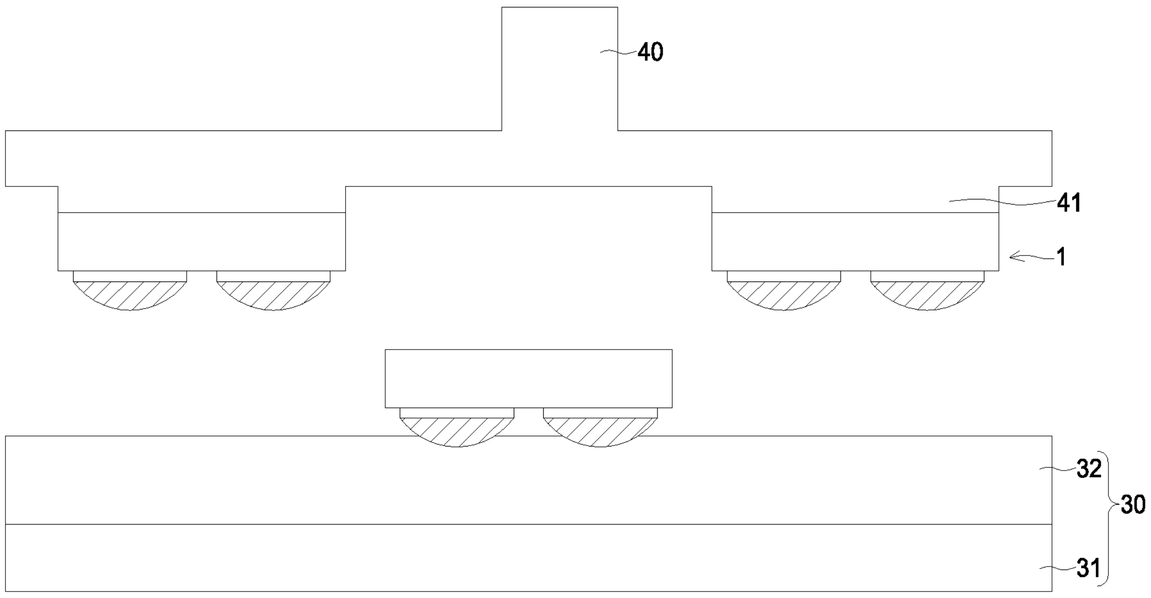
Figure 5C:
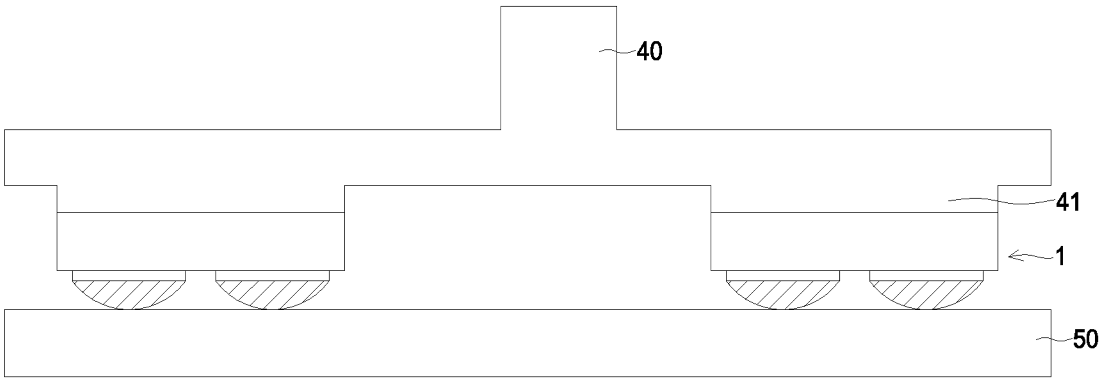
Figure 5D:
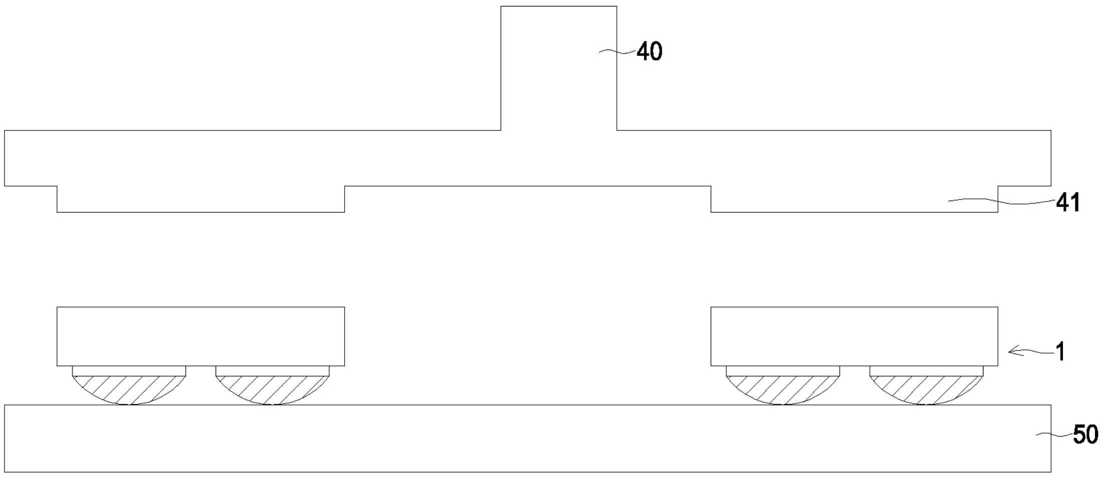

FIGS. 5A-5D show a step for transferring the semiconductor device 1, in accordance with an embodiment of the present disclosure. As shown in FIG. 5A, a plurality of semiconductor devices 1 is arranged in an array on the carrier 30. The plurality of semiconductor devices 1 is in contact with the adhesion layer 32 of the carrier 30 by portions of the surfaces of the conductive bumps so the plurality of semiconductor device 1 can be temporarily fixed onto the carrier 30. A pick-up tool 40 is provided to transfer the semiconductor device 1 from the carrier 30 to another location. The pick-up tool 40 has a plurality of grabbing portions 41, and each of the grabbing portions 41 is corresponded to the position of the semiconductor device 1 which is ready to be picked up. As shown in FIG. 5B, the pick-up tool 40 moves close to the plurality of semiconductor devices 1. After the grabbing portions 41 contacts some of the plurality of semiconductor devices 1, the pick-up tool moves upward so that the semiconductor devices 1 grabbed by the grabbing portions 41 leave the carrier 30. Notably, during the pick-up step, the adhesion between the grabbing portion 41 and the semiconductor device 1 should be greater than the adhesion between the semiconductor device 1 and the carrier 30. The semiconductor devices 1, which are not contacted by the grabbing portions 41, stay on the carrier 30. As shown in FIG. 5C, the pick-up tool 40 moves to a position above a predetermined place of the target substrate 50 together with the semiconductor devices 1 temporarily fixed on the grabbing portions 41. At this predetermined place, the semiconductor devices 1 may directly or indirectly contact the target substrate 50, and eventually be directly placed or fixed on the target substrate 50. As shown in FIG. 5D, the semiconductor devices 1 leave the pick-up tool 40 and stay on the target substrate 50, while the pick-up tool 40 may move to the same or a different carrier 30 to grab other semiconductor devices 1. The transferred semiconductor devices 1 are disposed on the substrate 50 in such a way that the conductive bumps 2 face the target substrate 50. The target substrate 50 may be a circuit board of a display, a thin-film transistor (TFT) substrate, a substrate having a redistribution layer (RDL), or a sub-mount substrate of a package. In another embodiment, the target substrate 50 may be a temporary carrier similar to the carrier 30. In FIGS. 5A-5D, the connection mode of the semiconductor device 1 and the carrier 30 is not limited to the form shown in FIG. 4A, and may be the forms shown in FIGS. 4D and 4E.

Figure 6A:
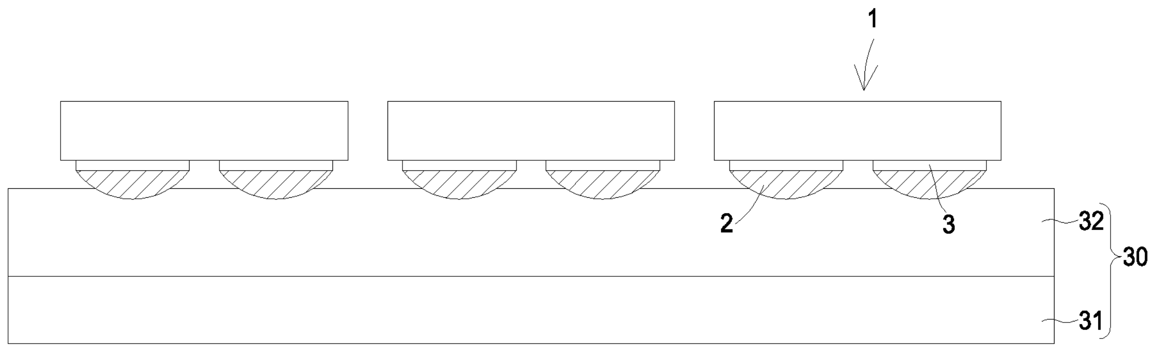
FIGS. 6A-6C are schematic views of various stages for transferring semiconductor devices in accordance with another embodiment of the present disclosure.
Figure 6B:
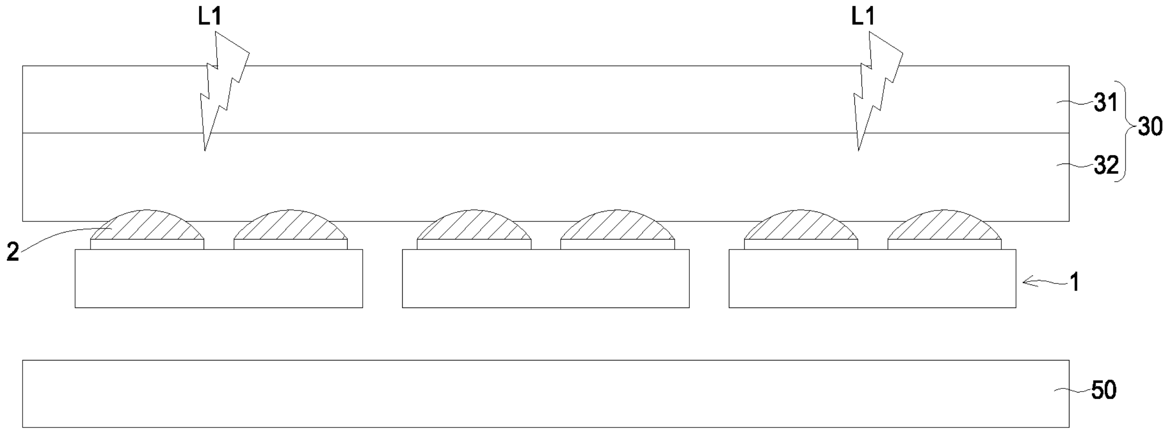
Figure 6C:
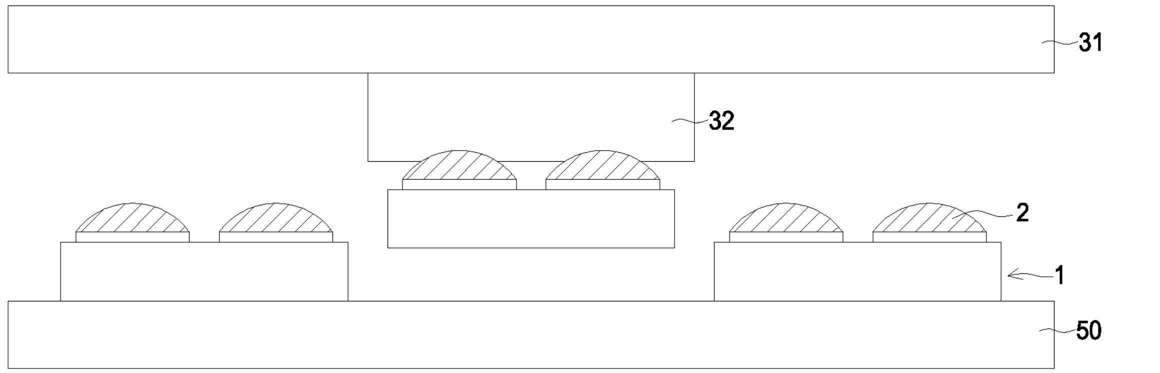

FIGS. 6A-6C are schematic views of a step for transferring the semiconductor device 1 in accordance with another embodiment of the present disclosure. FIG. 6A shows a plurality of semiconductor devices 1 disposed in an array on the carrier 30. Each semiconductor device 1 is in contact with the adhesion layer 32 of the carrier 30 by a portion of the surface of the conductive bumps 2 so the plurality of semiconductor devices 1 can be temporarily fixed onto the carrier 30. Then, the structure of FIG. 6A is flipped over or the target substrate 50 is moved, and such that the plurality of semiconductor devices 1 can be located between the carrier 30 and the target substrate 50 wherein the plurality of semiconductor devices 1 does not directly contact the target substrate 50. For example, as shown in FIG. 6B, the semiconductor device 1 is suspended over the target substrate 50. A laser energy L1 is provided to irradiate a specific place of the adhesion layer 32 from the side of the carrier plate 31, wherein the specific place corresponds to one of the semiconductor devices 1 which is ready to be transferred. The laser energy L1 may be a single-shot laser or a multi-shots laser. In an embodiment, one of the semiconductor devices 1 or a specific position of the adhesion layers 32 may be irradiated by one or more shots of laser during one irradiation process. In another embodiment, multiple places of the semiconductor devices 1 or of the adhesion layers 32 may be irradiated by one or more shots of laser, respectively, during one irradiation process. As shown in FIG. 6C, the adhesion layer 32 irradiated by the laser energy L1 may reduce the adhesion between the semiconductor device 1 and the adhesion layer 32, or cause the downward movement force of the semiconductor device 1 to be greater than the adhesion of the adhesive layer 3 to the semiconductor device 1, so that the semiconductor device 1 drops to the target substrate 50 from the carrier 30. The transferred semiconductor devices 1 are disposed on the target substrate 50 with the conductive bump 2 being away from the substrate 50. In another embodiment, in the step of FIG. 6B, the semiconductor devices 1 may directly contact the target substrate 50 first, and then, be irradiated by the laser energy L1, so that the semiconductor devices 1 may align to the target substrate 50 more precisely. After the step of FIG. 6C, a removal step may be optionally applied to the semiconductor devices 1 to remove the remaining adhesion layer 32 on the semiconductor devices 1. The removal step may include a dry etch or a wet etch, and the dry etch may be an oxygen plasma etching process. In FIGS. 6A-6C, the connection mode of the semiconductor devices 1 and the carrier 30 is not limited to the form shown in FIG. 4A, and may also be the form shown in FIGS. 4D and 4E.

Figure 7A:
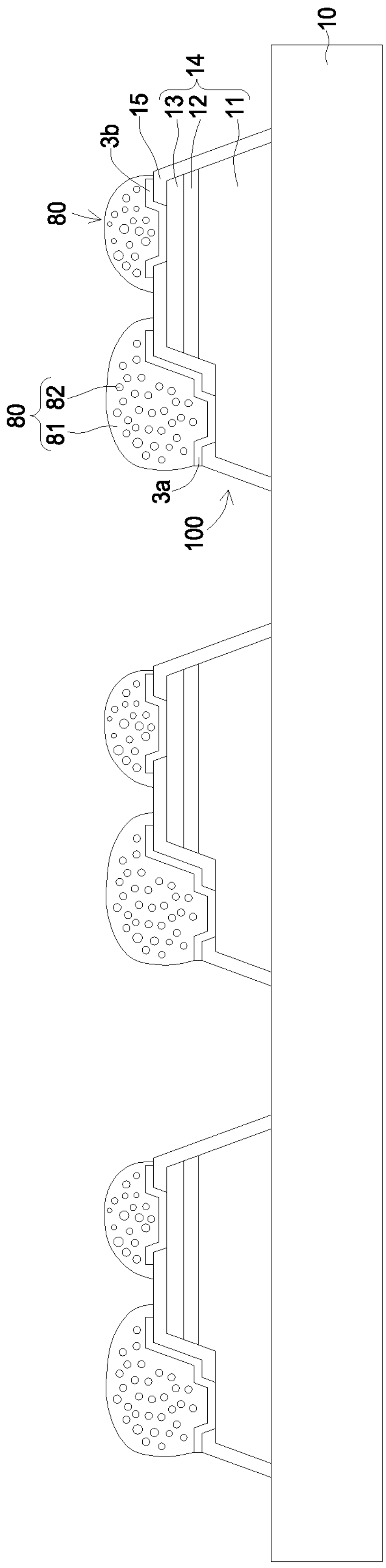
FIGS. 7A-7D are schematic views of various stages in a method of manufacturing semiconductor devices in accordance with an embodiment of the present disclosure.

FIGS. 7A-7D are schematic views of steps for forming a semiconductor device 1 in accordance with an embodiment of the present disclosure. As shown in FIG. 7A, a plurality of semiconductor units 100 is disposed on a substrate 10. The semiconductor unit 100 includes a semiconductor stack 14, a protective layer 15, a first electrode 3*a*, and a second electrode 3*b*. The plurality of semiconductor units 100 is disposed on the substrate 10 with the first electrodes 3*a* and the second electrodes 3*b* being away from the substrate 10. The first electrode 3*a* and the second electrode 3*b* have recesses respectively. For the structures of the first electrode 3*a* and the second electrode 3*b*, references can be made to the aforementioned relevant paragraphs. Then, for each of the plurality of semiconductor units 100, two lumps of glue material 80 separated from each other are formed over the first electrode 3*a* and the second electrode 3*b*, respectively. The glue material 80 includes resin 81 and a plurality of conductive particles 82 distributed in the resin 81. In an embodiment, the glue material 80 may be formed by printing, coating, spraying, or dispensing. The printing may include aerosol jet printing or ink-jet printing. The material of the resin 81 includes thermosetting plastics and a soldering flux. The thermosetting plastics may be epoxy, silicone, polymethylmethacrylate (PMMA), or episulfide. The melting point of the conductive particle 82 is lower than the solid point of the resin 81. In an embodiment, the material of the conductive particle 82 may be gold, silver, or copper. In another embodiment, the material of the conductive particle 82 may be a low melting point metal or a low liquidus melting point alloy. In an embodiment, the melting point of the low melting point metal or the liquidus temperature of the low liquidus melting point alloy is lower than 210° C. In another embodiment, the melting point of the low melting point metal or the liquidus temperature of the low liquidus melting point alloy is lower than 170° C. The material of the low liquidus melting point alloy may be a tin alloy, such as a tin-indium alloy and tin-bismuth alloy.

Figure 7B:
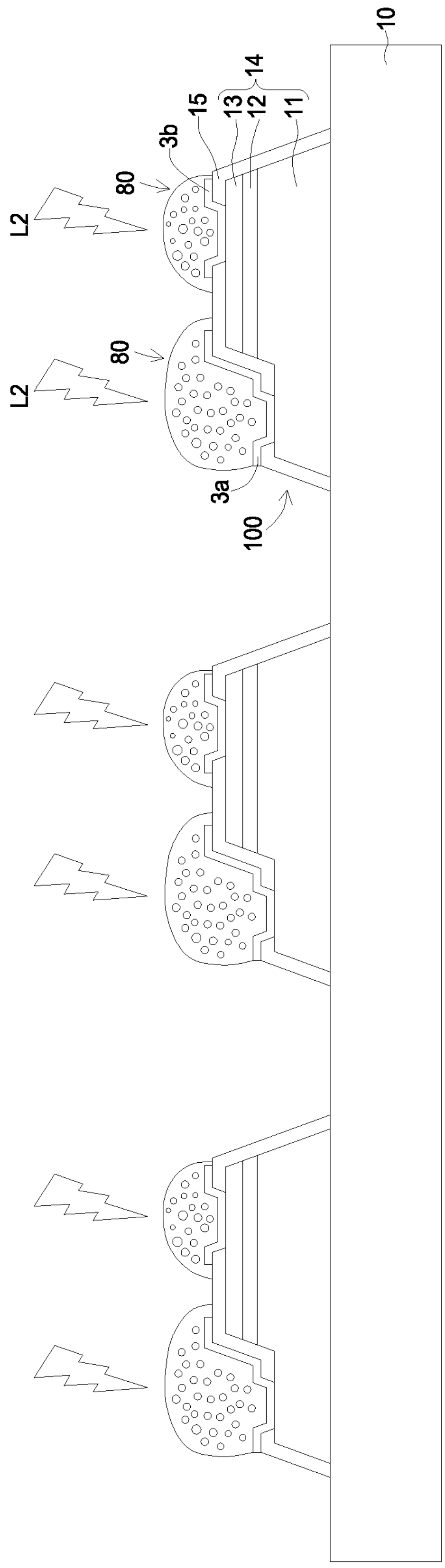
Figure 7C:
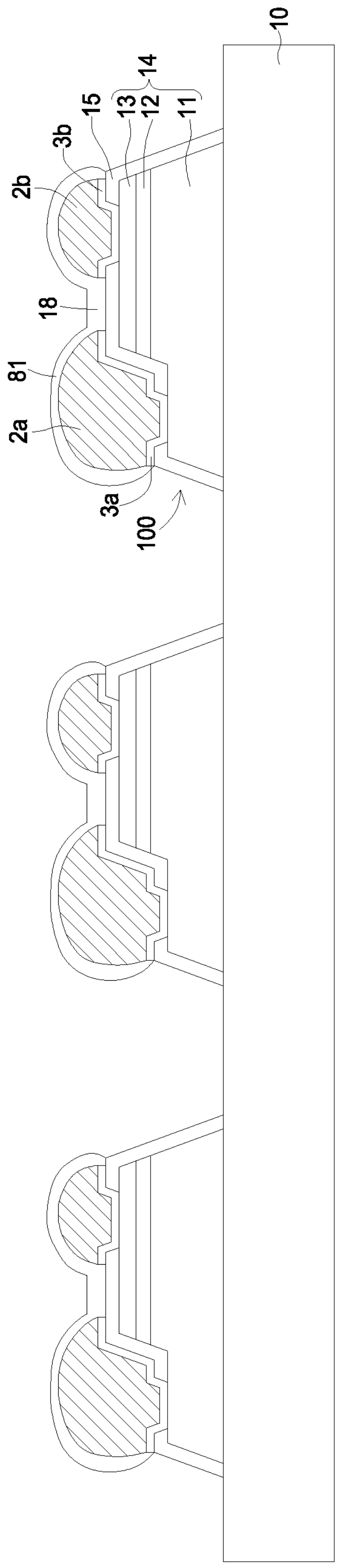
Figure 7D:
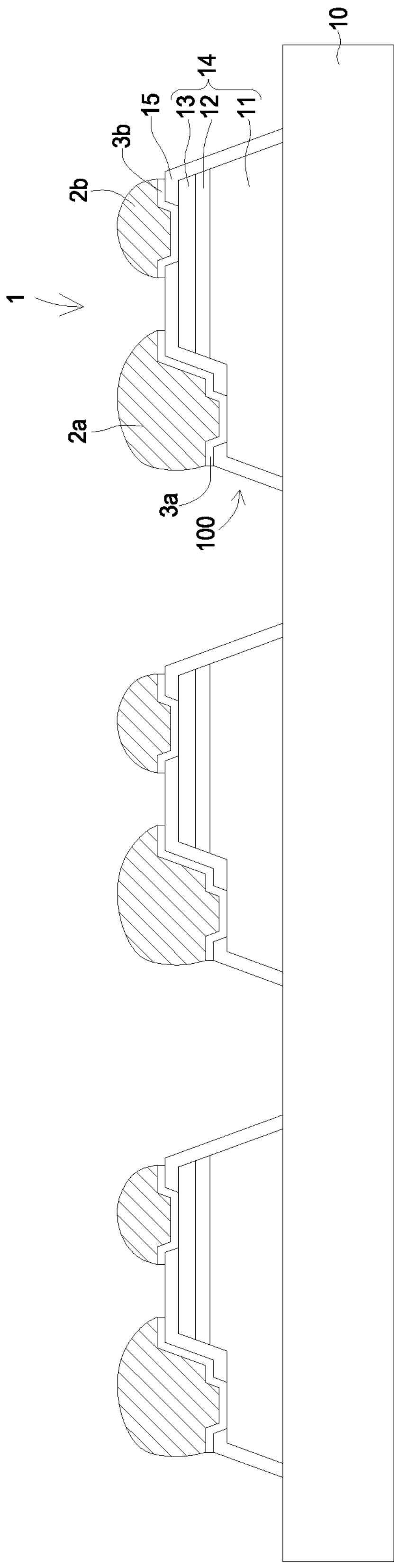

As shown in FIG. 7B, a laser energy L2 is used to irradiate the glue material 80 or neighboring regions thereof to heat the glue material 80. The laser energy L2 may include UV laser beam, visible light laser beam, or IR laser beam. In an embodiment, the laser energy L2 is an IR pulse mode laser beam with wavelength of 750-2,000 nm, spot size of 0.004-0.002 $cm^2$, beam diameter of 100-500 μm, pulse width (duration) of less than 20 ms, frequency of 500-4000 Hz, duty cycle of 1%-10%, laser power of 100 W, and laser energy of 595~850 $J/cm^2$. As shown in FIG. 7C, during the heating process, the conductive particles 82 gather on the first electrode 3*a* and the second electrode 3*b* to form the first conductive bump 2*a* and the second conductive bump 2*b*, wherein the first conductive bump 2*a* and the second conductive bump 2*b* are convex and have arc outer surfaces. The resin 81 moves over the first conductive bump 2*a*, second conductive bump 2*b*, and the region 18 between the first electrode 3*a* and the second electrode 3*b*. After the heating process, the first conductive bump 2*a* and the second conductive bump 2*b* are cured, and the resin 81 covering the first conductive bump 2*a* and the second conductive bump 2*b* is also heated but not completely cured, so the resin 81 is in a liquid or semi-liquid state. Then, as shown in FIG. 7D, a cleaning step is performed to remove the uncured resin 81 so that the first conductive bump 2*a* and the second conductive bump 2*b* are exposed to the external environment for contacting the carrier plate in subsequent transferring process. The cleaning process may be performed with a solvent, and the solvent may include N-methylpyrrolidinone (NMP), methyl ethyl ketone (MEK), acetone (ACE), or isopropyl alcohol.

Figure 8A:
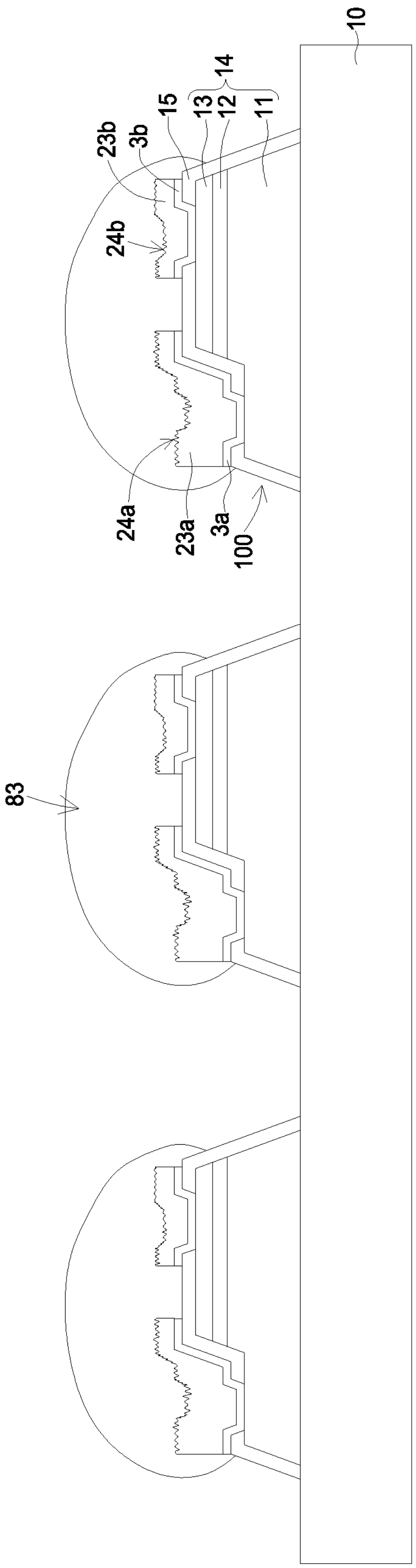
FIGS. 8A-8D are schematic views of various stages in a method of manufacturing semiconductor devices in accordance with another embodiment of the present disclosure.

FIGS. 8A-8D are schematic views of steps for forming the semiconductor device 1 in accordance with another embodiment of the present disclosure. As shown in FIG. 8A, a plurality of semiconductor units 100 is disposed over a substrate 10. The semiconductor unit 100 includes a semiconductor stack 14, a protective layer 15 a first electrode 3*a*, and a second electrode 3*b*. The plurality of semiconductor units 100 is disposed over the substrate 10 with the first electrode 3*a* and the second electrode 3*b* being away from the substrate 10. The first electrode 3*a* and the second electrode 3*b* have recesses respectively. For the structures of the first electrode 3*a* and the second electrode 3*b*, references can be made to the aforementioned relevant paragraphs. A first bonding pad 23*a* and a second bonding pad 23*b* are formed respectively on the first electrode 3*a* and the second electrode 3*b* by using a method of electroplating, chemical plating, or evaporation deposition. The upper surface 24*a* of the first bonding pad 23*a* and the upper surface 24*b* of the second bonding pad 23*b* are substantially conformal with the upper surface of the first electrode 3*a* and the second electrode 3*b* (i.e., the profiles of the both are similar), and have recesses and/or rough texture. A single lump of the glue materials 83 is formed over the semiconductor unit 100, first bonding pad 23*a*, and the second bonding pad 23*b* of each of the plurality of semiconductor units 100. The glue material 83 only includes resin in this example. In another embodiment, the glue material 83 includes resin and lower concentration conductive particles (compared to the conductive particles of FIG. 7A). In an embodiment, the forming of the glue material 80 may be printing, coating, spraying, or dispensing. The printing may include aerosol jet printing or ink-jet printing. For the material of the first bonding pad 23*a* and the second bonding pad 23*b*, references can be made to the aforementioned relevant paragraphs of the conductive bump 2*a*, 2*b*. For the material of the resin, reference can be made to the aforementioned relevant paragraphs.

Figure 8B:
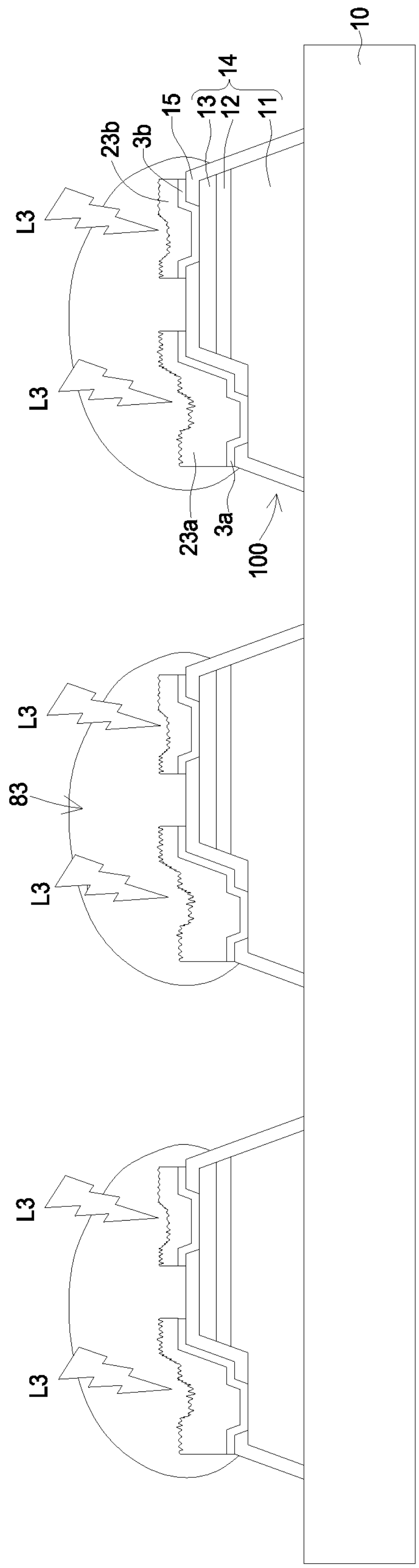
Figure 8C:
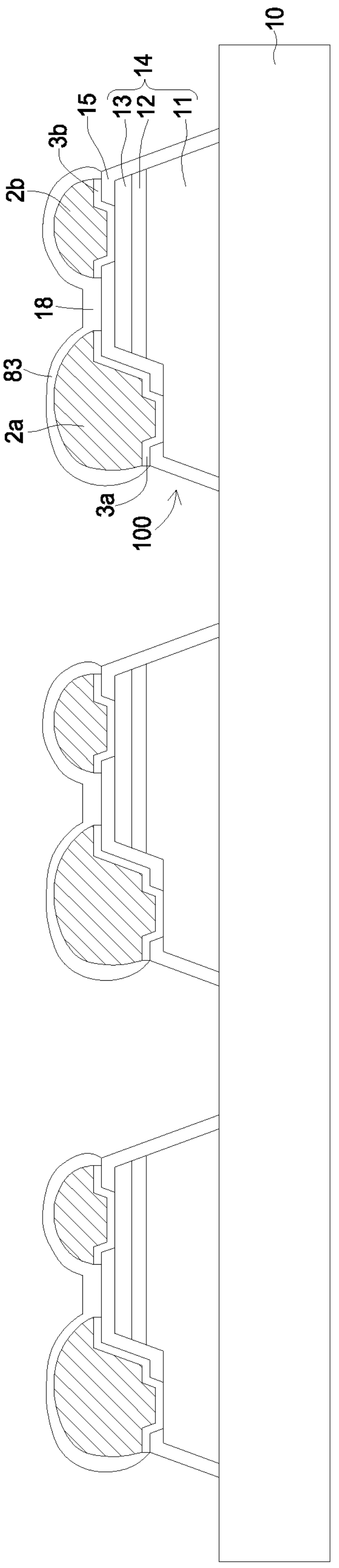
Figure 8D:
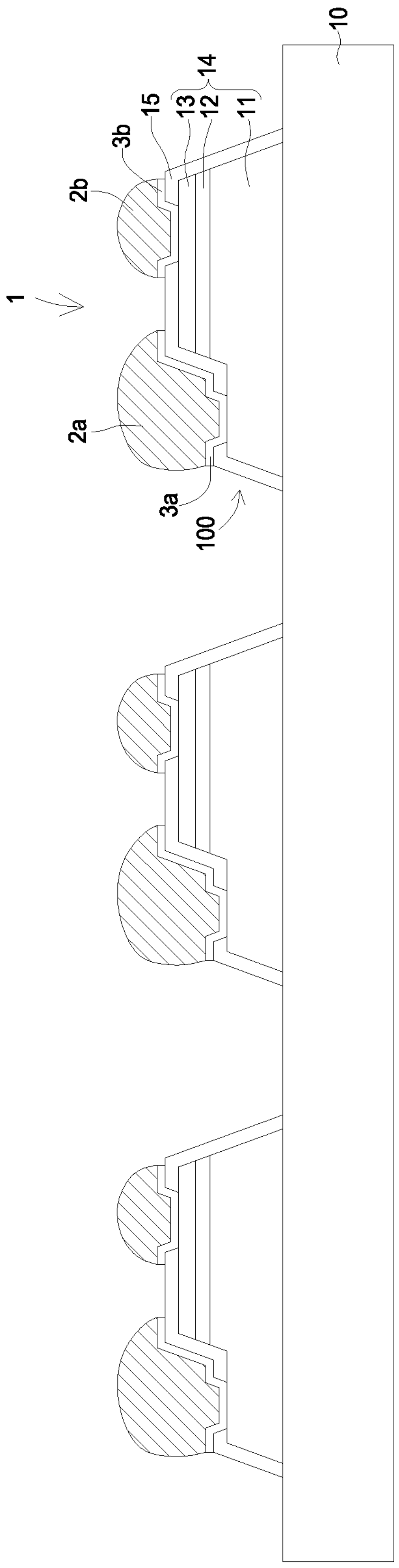

As shown in FIG. 8B, the first bonding pad 23*a* and the second bonding pad 23*b* are irradiated with a laser energy L3 to heat the glue materials 83, first bonding pad 23*a*, and the second bonding pad 23*b*. The laser energy L3 may include UV laser beam, visible light laser beam, or IR laser beam. In an embodiment, the laser energy L3 is IR laser beam with the wavelength of 750-2,000 nm. As shown in FIG. 8C, during the heating process, the first bonding pad 23*a* and the second bonding pad 23*b* are heated to melt in the glue material 83 and gather on the first electrode 3*a* and the second electrode 3*b* (if the resin includes conductive particles, some or all of the heated conductive particles may also move toward the first electrode 3*a* and the second electrode 3*b*) to form a first conductive bump 2*a* and the second conductive bump 2*b*, wherein the first conductive bump 2*a* and the second conductive bump 2*b* are convex and have arc outer surfaces. The glue material 83 moves over the first conductive bump 2*a*, the second conductive bump 2*b*, and the region 18 between the first electrode 3*a* and the second electrode 3*b*. After the heating process, the first conductive bump 2*a* and the second conductive bump 2*b* are cured, and the glue material 83 (or resin) covering thereon is heated but not completely cured, so the resin 81 is in a liquid or semi-liquid state. Then, as shown in FIG. 8D, A cleaning process is performed to remove the uncured glue material 83 (or resin) so that the first conductive bump 2*a* and the second conductive bump 2*b* are exposed to external environment for contacting the carrier plate in subsequent transferring process. For the cleaning process, reference can be made to the aforementioned relevant paragraphs of FIG. 7D.

Figure 9A:
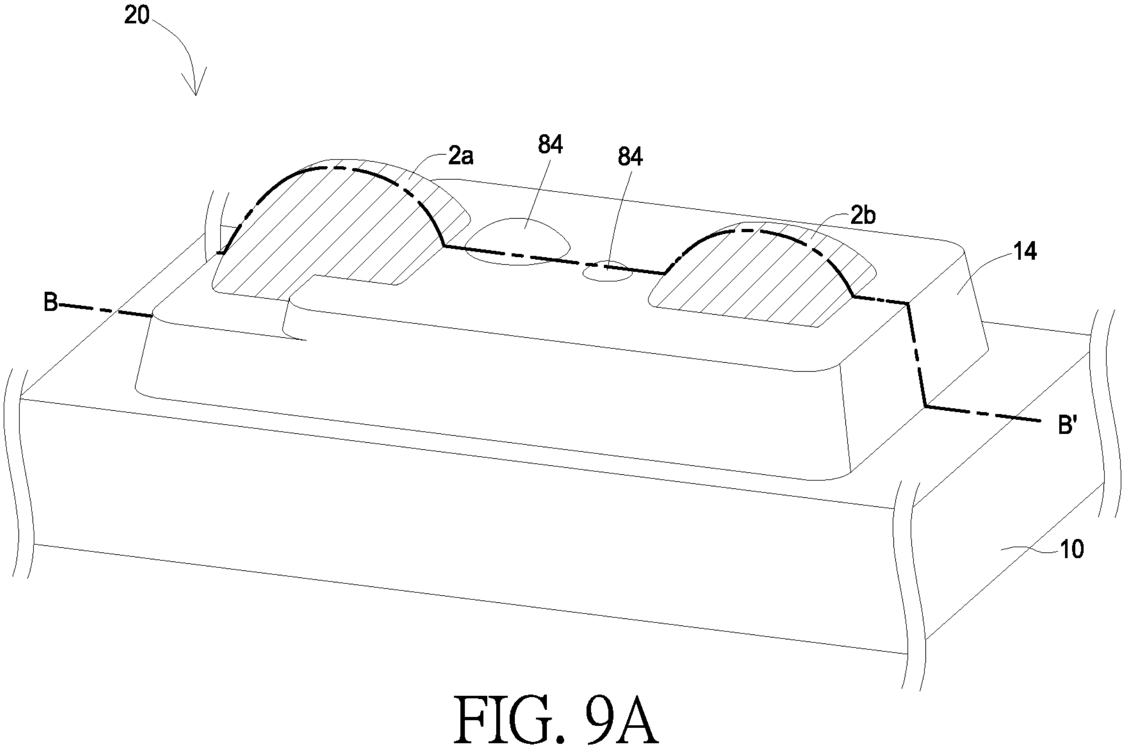
FIG. 9A is a three-dimensional view of a semiconductor device in accordance with another embodiment of the present disclosure.
Figure 9B:
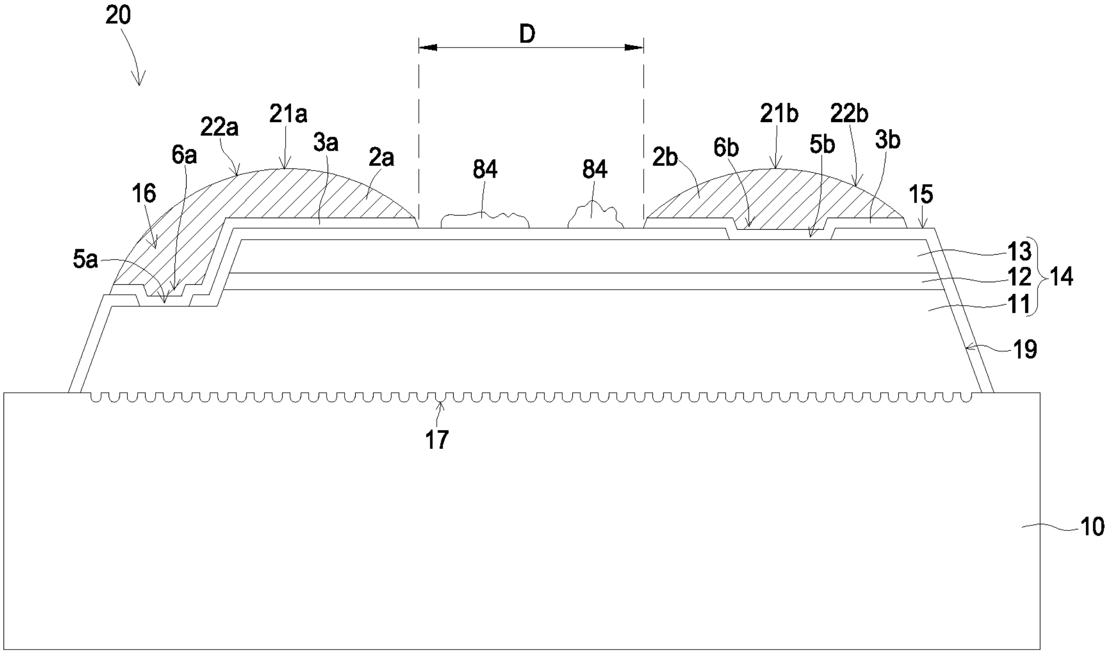
FIG. 9B is a cross-sectional view of a semiconductor device taken along line B-B' of FIG. 9A.

In another embodiment, during the cleaning process of FIGS. 7D and 8D, if the glue material between the conductive bumps 2*a* and 2*b* is not cleaned completely and remained on the semiconductor device 100, the maximum level height of the remaining glue material is preferably not higher than the conductive bumps 2*a* and 2*b* for preventing from affecting the subsequent transfer and die-bonding process. FIG. 9A is a three-dimensional view of a semiconductor device 20 in accordance with another embodiment of the present disclosure. FIG. 9B is a cross-sectional view taken along the line B-B' of the semiconductor device 20 of FIG. 9A. Referring to FIG. 9A, the upper side of the semiconductor device 20 has a first conductive bump 2*a* and a second conductive bump 2*b* separated from each other. Between the first conductive bump 2*a* and the second conductive bump 2*b*, at least one lump of remaining glue material 84 is covered on the semiconductor device 20. In the top view, two lumps of remaining glue material 84 have irregular shapes and different areas. Referring to FIG. 9B, the semiconductor device 20 has a semiconductor stack 14, a protective layer 15, a first electrode 3*a*, a second electrode 3*b*, a first conductive bump 2*a*, and a second conductive bump 2*b*. The outermost side 19 of the semiconductor stack 14 is an inclined plane that is inclined with respect to the substrate 10. The semiconductor stack 14 includes a first semiconductor layer 11, an active layer 12, and a second semiconductor layer 13. The remaining glue material 84 is on the protective layer 15 between the first conductive bump 2*a* and the second conductive bump 2*b*. The uppermost surface of the remaining glue material 84 is not higher than the maximum level height of the first conductive bump 2*a* and the second conductive bump 2*b*, and has a rough outer surface. Since the height of the remaining glue material 84 is not beyond that of the conductive bump 2*a* and 2*b*, the subsequent transferring and die-bonding process may not be affected.

Figure 10A:
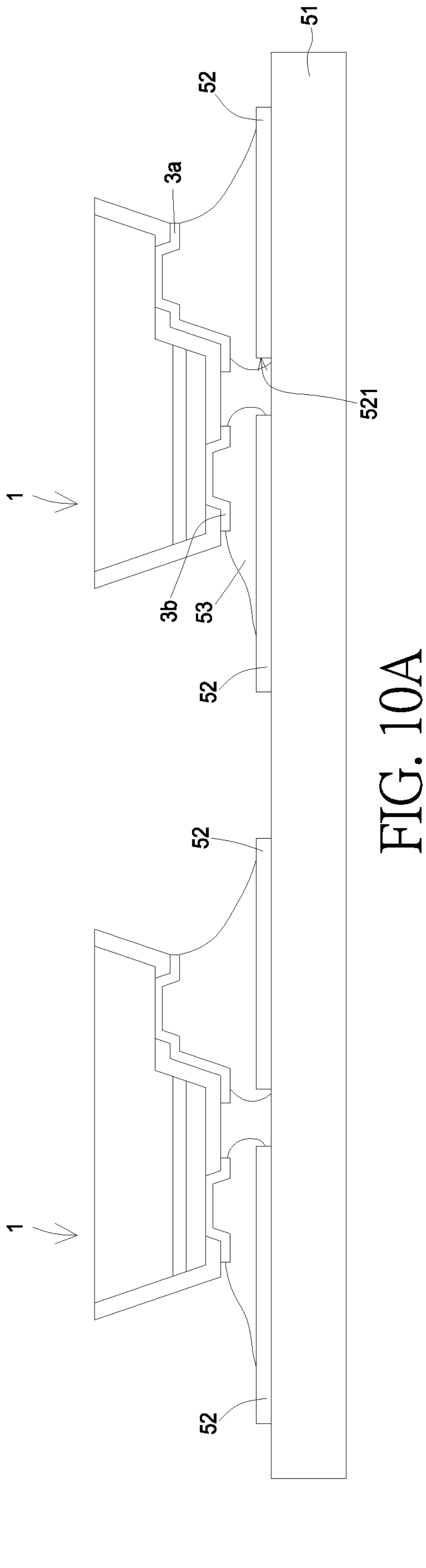
FIG. 10A is a schematic view of a semiconductor device fixed on the target substrate in accordance with an embodiment of the present disclosure.
Figure 10B:
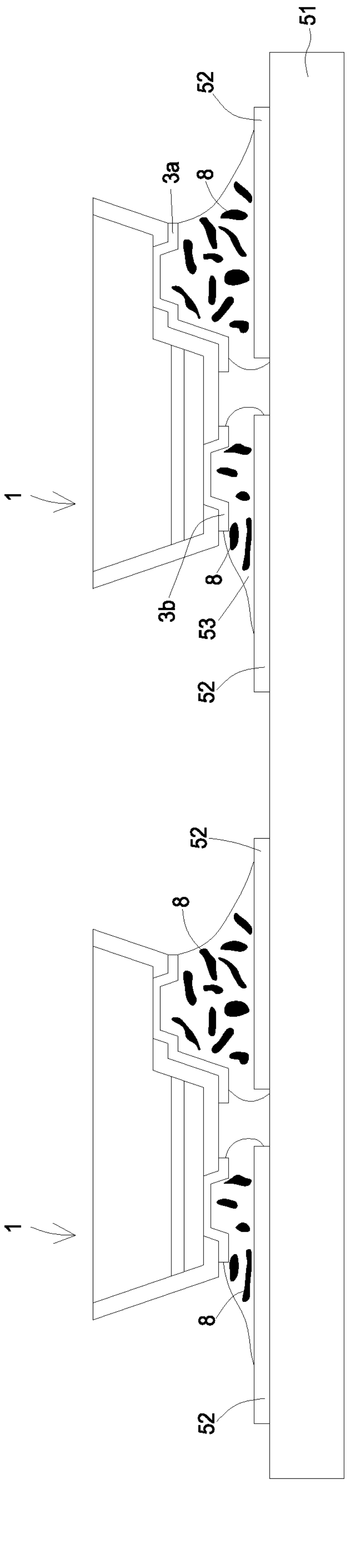
FIG. 10B is a schematic view of a semiconductor device fixed on the target substrate in accordance with another embodiment of the present disclosure.

FIG. 10A is a semiconductor device 1 bonded on the target substrate 51 in accordance with an embodiment of the present disclosure. The target substrate 51 may be a circuit board of a display, a TFT substrate, a substrate having redistribution layer (RDL), or a sub-mount substrate of a package. The target substrate 51 has a plurality of conductive connecting pads 52 thereon. The semiconductor device 1 may be any of the structure mentioned previously. The conductive bumps are heated to melt and cured to form bonding layers 53 for connecting the semiconductor device 1 and the conductive connecting pads 52. The semiconductor device 1 may receive an electrical and/or driving signal through the conductive connecting pads 52 and the bonding layers 53. The bonding layer 53 may selectively cover the lateral surface 521 of the conductive connecting pad 52. During the process of heating the conductive bump to form the bonding layer 53, discrete metal particles may appear in the bonding layer 53 due to the adjustment of the process parameters, such as heating temperature, and heating time. FIG. 10B is a schematic view of a semiconductor device 1 bonded on the target substrate 51 in accordance with another embodiment of the present disclosure. After the bonding layer 53 is cured, irregular particles 8 appear in the bonding layer 53. In other words, the bonding layer 53 has discretely distributed and irregularly shaped particles 8 distributed therein, wherein the material of the particles 8 is different from the material of the bonding layer 53, but partially the same as the material of the electrode 3*a*, 3*b* and/or the conductive connecting pad 52 of the semiconductor device 1, such as gold, platinum, and alloys thereof. In an embodiment, a laser energy may be used in the heating-to-cure method, and the laser energy may include UV laser beam, visible light laser beam, and IR laser beam. In an embodiment, the wavelength of the IR laser beam is 750-2,000 nm.

The aforementioned embodiments are only for illustrating the technical ideas and features of the present disclosure, and their purpose is to enable those skilled in the art to understand the contents of the present disclosure and implement them accordingly, instead of limiting the patent scope of the present disclosure. All equivalent changes or modifications made according to the spirit disclosed in the present disclosure should be covered by the patent scope of the present disclosure.

What is claimed is:

1. A method of manufacturing a semiconductor device, comprising:

providing a substrate;

forming a semiconductor stack on the substrate, the semiconductor stack comprising a side surface;

forming a first electrode on the side surface of the semiconductor stack and a second electrode on the semiconductor stack;

forming a first resin on the first electrode and a second resin on the second electrode and physically separated from the first resin; and forming a first conductive bump on the first electrode and the second conductive bump on the second electrode, wherein the first conductive bump is covered by the first resin and the second conductive bump is covered by the second resin.

2. The method according to claim 1, further comprising a step of cleaning the resin.

3. The method according to claim 2, further comprising providing a target substrate and bonding the first conductive bump and the second conductive bump to the target substrate.

4. The method according to claim 3, wherein the bonding process comprises a laser applied to the first conductive bump and the second conductive bump.

5. The method according to claim 3, wherein the step of the forming the first conductive bump and the step of bonding the first conductive bump to the target substrate are separately performed.

6. The method according to claim 1, further comprising a plurality of conductive particles distributed in the first resin and the second resin, and the conductive particles are subjected to a heat process to gather to form the first conductive bump and the second conductive bump.

7. The method according to claim 6, wherein the heat process comprises a laser energy irradiating on the conductive particles.

8. The method according to claim 7, wherein the laser energy comprises an IR laser beam.

9. The method according to claim 6, wherein the resin is in a liquid or semi-liquid state during the heat process.

10. The method according to claim 1, wherein the first conductive bump has an outermost surface, and the outermost surface is not parallel with the first electrode and has a convex arc shape.

11. The method according to claim 10, wherein the formation of the first resin and the second resin comprises printing, coating, spraying, or dispensing.

12. The method according to claim 1, further comprising a first bonding pad on the first electrode, and the first bonding pad is subjected to a heat process to form the first conductive bump.

13. The method according to claim 12, wherein the heat process comprises a laser energy irradiating on the first bonding pad.

14. The method according to claim 1, wherein the semiconductor stack further comprises a first semiconductor layer, a second semiconductor layer and an active layer disposed between the first semiconductor layer and the second semiconductor layer.

15. The method according to claim 14, wherein the active layer comprises a width less than the first semiconductor layer.

16. The method according to claim 1, wherein the semiconductor stack further comprises a protective layer between the first electrode and the side surface of the semiconductor stack.

17. A method of manufacturing a semiconductor device, comprising:

providing a substrate;

forming a semiconductor stack on the substrate;

forming an electrode on the semiconductor stack;

forming a bonding pad on the electrode;

directly irradiating the bonding pad to form a conductive bump by a first laser energy;

providing a target substrate; and bonding the conductive bump to the target substrate by a second laser energy.

18. The method according to claim 17, wherein one of the first laser energy comprises an IR laser beam.

19. The method according to claim 17, wherein the bonding pad comprises an outermost surface with a concave shape.

* * * * *